(12) United States Patent
Kim et al.

(10) Patent No.: US 12,183,611 B2
(45) Date of Patent: Dec. 31, 2024

(54) FLOW MODIFICATION FIXTURE FOR AN EQUIPMENT FRONT END MODULE

(71) Applicant: ENTEGRIS, INC., Billerica, MA (US)

(72) Inventors: Seong Chan Kim, Carver, MN (US); Gregory Alan Schelske, Elk River, MN (US)

(73) Assignee: ENTEGRIS, INC., Billerica, MA (US)

( * ) Notice: Subject to any disclaimer, the term of this patent is extended or adjusted under 35 U.S.C. 154(b) by 1412 days.

(21) Appl. No.: 15/736,716

(22) PCT Filed: Jun. 14, 2016

(86) PCT No.: PCT/US2016/037363
§ 371 (c)(1),
(2) Date: Dec. 14, 2017

(87) PCT Pub. No.: WO2016/205191
PCT Pub. Date: Dec. 22, 2016

(65) Prior Publication Data
US 2018/0174875 A1 Jun. 21, 2018

Related U.S. Application Data

(60) Provisional application No. 62/305,651, filed on Mar. 9, 2016, provisional application No. 62/240,925, filed on Oct. 13, 2015, provisional application No. 62/181,018, filed on Jun. 17, 2015.

(51) Int. Cl.
*H01L 21/67* (2006.01)
*H01L 21/673* (2006.01)
*H01L 21/677* (2006.01)
*G05D 7/01* (2006.01)

(52) U.S. Cl.
CPC .. *H01L 21/67393* (2013.01); *H01L 21/67017* (2013.01); *H01L 21/67772* (2013.01); *G05D 7/0186* (2013.01)

(58) Field of Classification Search
CPC ......... H01L 21/67772; H01L 21/67393; H01L 21/67017; G05D 7/0186
See application file for complete search history.

(56) References Cited

U.S. PATENT DOCUMENTS

| | | | |
|---|---|---|---|
| 6,704,998 B1 | 3/2004 | Bonora et al. | |
| 7,065,898 B2 * | 6/2006 | Kim | H01L 21/67017 34/78 |
| 7,416,998 B2 | 8/2008 | Kisakibaru et al. | |

(Continued)

FOREIGN PATENT DOCUMENTS

| | | |
|---|---|---|
| JP | 2003045933 A | 2/2003 |
| JP | 2008180484 A | 8/2008 |

(Continued)

*Primary Examiner* — Steven S Anderson, II

(57) ABSTRACT

An equipment front end module. An equipment front end module (EFEM) includes a flow modification feature projecting away from an interior wall of the equipment front end module and extending into an interior of the equipment front end module (EFEM) at an angle. The flow modification feature modifies the flow of gas flowing from a top to a bottom of the EFEM by deflecting gas flow away and/or laminarizing gas flow across an opening of the EFEM, which may improve the purge performance of a wafer carrier docked at the EFEM.

10 Claims, 23 Drawing Sheets

(56) References Cited

U.S. PATENT DOCUMENTS

| | | | |
|---|---|---|---|
| 7,635,244 B2* | 12/2009 | Sakiya | H01L 21/67017 |
| | | | 414/217 |
| 9,105,673 B2* | 8/2015 | Babbs | H01L 21/67778 |
| 10,964,565 B2* | 3/2021 | Ryu | H01L 21/67196 |
| 2003/0031537 A1* | 2/2003 | Tokunaga | H01L 21/67772 |
| | | | 414/217 |
| 2007/0151620 A1* | 7/2007 | Okabe | H01L 21/67017 |
| | | | 414/217 |
| 2009/0035099 A1* | 2/2009 | Okabe | H01L 21/67772 |
| | | | 414/217 |
| 2009/0035100 A1 | 2/2009 | Okabe et al. | |
| 2009/0169342 A1 | 7/2009 | Yoshimura et al. | |
| 2010/0202093 A1 | 8/2010 | Yamawaku | |
| 2015/0024671 A1 | 1/2015 | Taniyama et al. | |
| 2015/0170945 A1* | 6/2015 | Segawa | H01L 21/67115 |
| | | | 414/217 |
| 2015/0294888 A1 | 10/2015 | Iwamoto | |

FOREIGN PATENT DOCUMENTS

| | | | |
|---|---|---|---|
| JP | 2009038074 A | | 2/2009 |
| JP | 2010183005 A | | 8/2010 |
| JP | 2015204344 A | | 11/2015 |
| KR | 100990859 B1 | * | 10/2010 |
| KR | 20150009421 A | | 1/2015 |

* cited by examiner

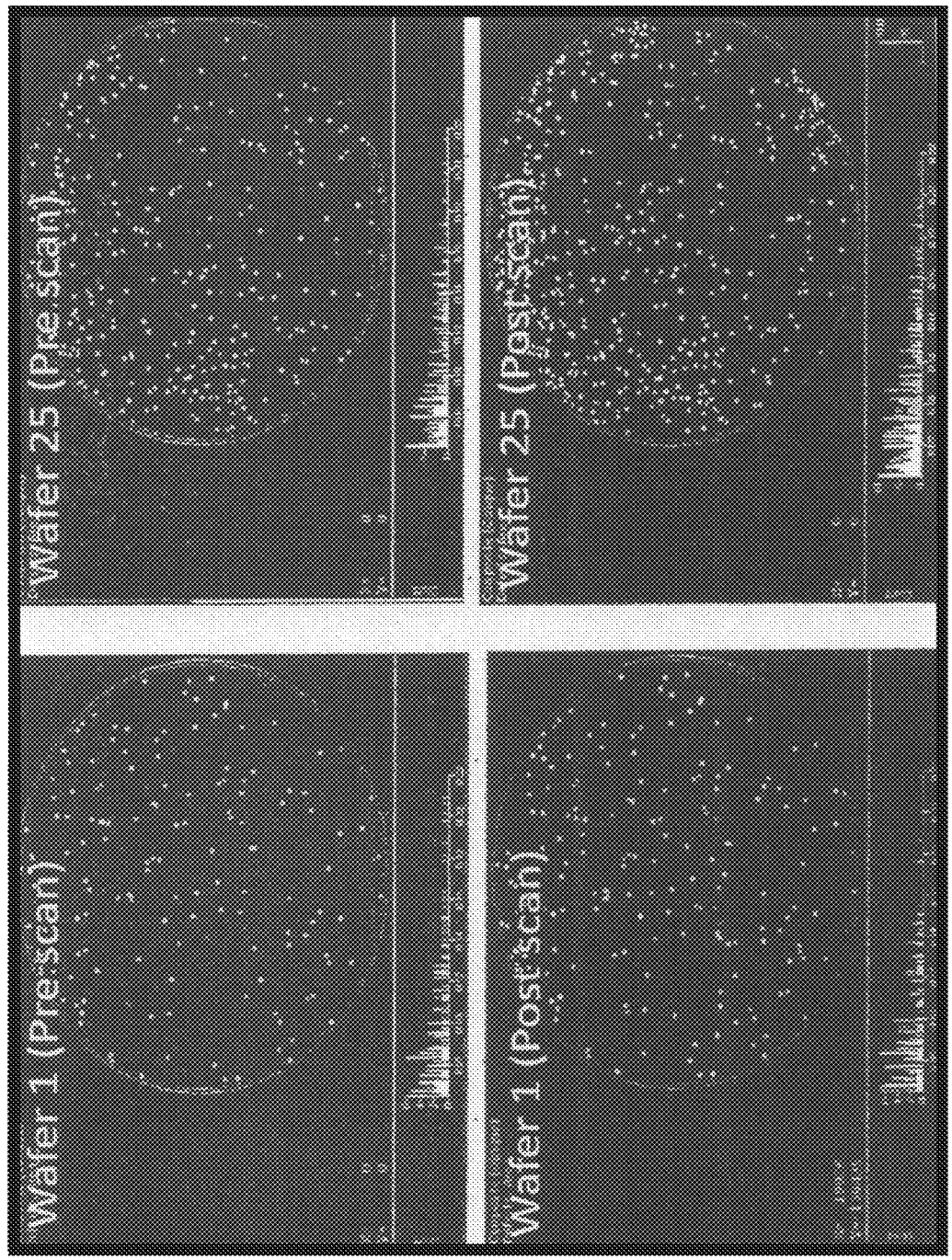

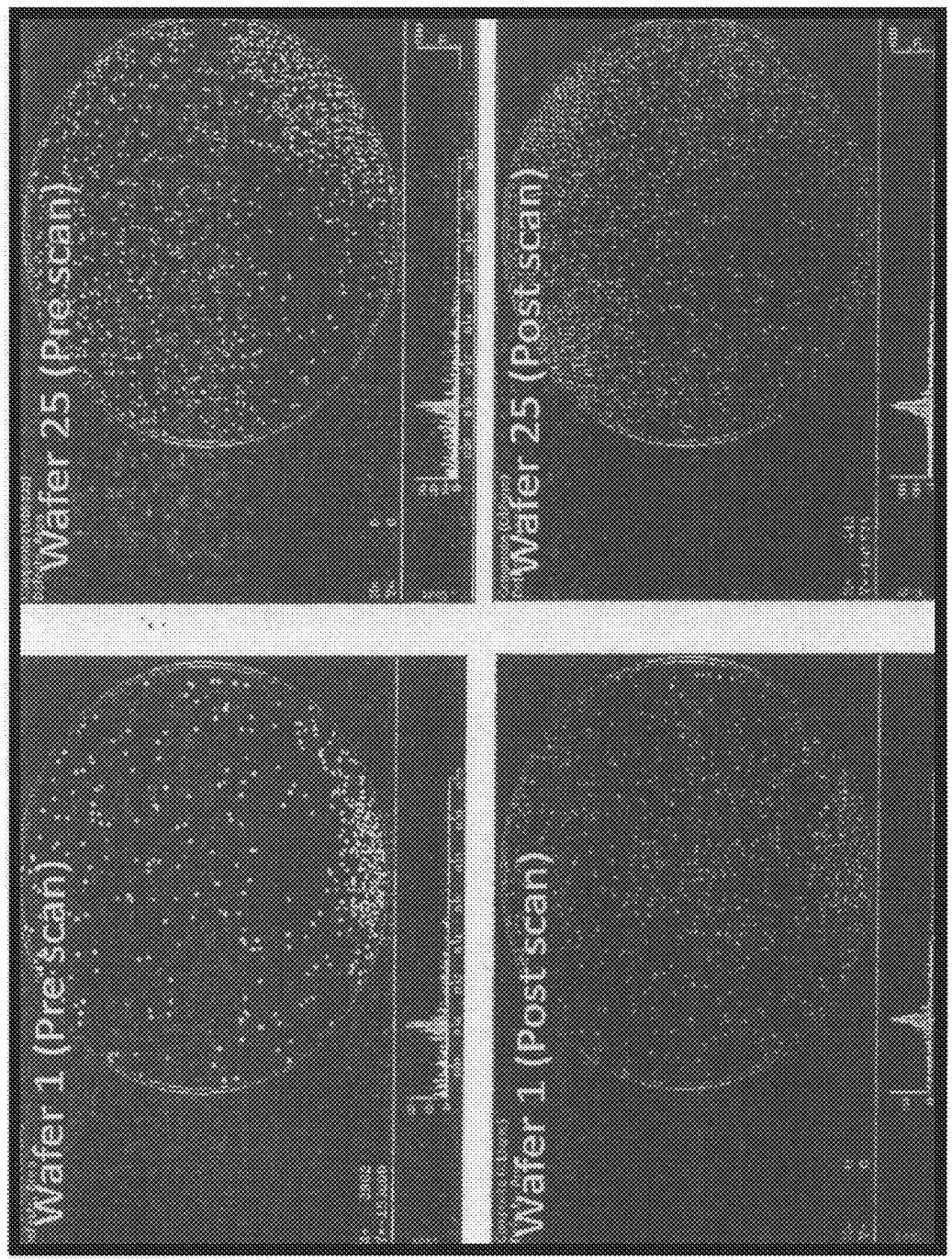

FLOW MODIFICATION FIXTURE FOR AN EQUIPMENT FRONT END MODULE

RELATED APPLICATIONS

This application claims the benefit of and priority to: U.S. Provisional Application No. 62/181,018 filed on Jun. 17, 2015; U.S. Provisional Application No. 62/240,925 filed on Oct. 13, 2015; and U.S. Provisional Application No. 62/305,652 filed on Mar. 9, 2017, the entireties of which are incorporated herein by reference for all purposes.

TECHNICAL FIELD

The disclosure relates generally to automation equipment used to process silicon wafers and other substrates for the semiconductor manufacturing industry, and more particularly, to a fixture for modifying gas flow inside an equipment front end module used in the processing of silicon wafers and other substrates.

BACKGROUND

Modern semiconductor fabrication facilities (known as "fabs") use tools that can process multiple wafers. The wafers are typically delivered to a tool from a stocker using a front opening unified pod (FOUP). The FOUPS may be hand carried to and from the tool or they may be delivered by an automated material handling system (AMHS) or overhead track (OHT) system. Wafers are transferred from the FOUPs to the tool through an equipment front end module (EFEM). The EFEM generally includes a load port for receiving the carrier, a transfer unit and a frame or "mini-environment."

FIG. 1 shows a known FOUP 2 with purging capabilities. The FOUP 2 includes an open front 4, a door 6, and a wafer container portion 8. Wafers W are inserted and removed horizontally through the open front 4. Slots (not visible) formed in the interior sides of the wafer container portion 8 accommodate the wafers W. The door 6 can include a seal, and can sealingly engage the wafer container portion 8 to form an internal environment that is isolated from the ambient atmosphere.

Referring to FIG. 2, the FOUP 2 also can include a purge tower 10. The purge tower 10 may be located toward the rear of the wafer container portion S. The purge tower 10 facilitates the flow of gaseous working fluid or purge gas into a substrate container such that the purge gas can be directed toward and away from the wafers housed in the FOUP. The purge gas will sweep the container and its contents, picking up residual moisture, oxygen and atmospheric micro-contaminants (AMCs) and encouraging movement of particulates toward an outlet port or door opening.

Purge gas is introduced into the FOUP internal environment to achieve and maintain low relative humidity and oxygen levels within the internal FOUP environment. One challenge of purging is to evenly distribute the purge gas quickly and effectively over the substrates within the container to achieve low relative humidity and oxygen levels, particularly when the FOUP door 6 is removed.

New purging technologies have been introduced to achieve and maintain low relative humidity (RH) conditions and/or low oxygen levels within a FOUP environment or other substrate container environment. However, the purge performance of an exemplary FOUP can be very sensitive to gas flow at the interface between the EFEM load port and the FOUP opening when the FOUP door is in an open state. Various EFEM structure(s) can cause turbulent gas flow when the FOUP is docked at the EFEM and the FOUP door is open to the EFEM load port. Additionally, the gas flowing within the EFEM may be deflected into the open FOUP. Turbulent gas flow at the FOUP-EFEM interface and possible deflection of the gas into the FOUP interior may disrupt the purge performance of the FOUP resulting in non-uniform humidity and oxygen levels within the microenvironment, making it difficult to achieve and maintain a reduced relative humidity condition inside the FOUP. In addition, there are numerous EFEM configurations used throughout the semiconductor industry. This can make it difficult to achieve a uniform FOUP open-door purge performance across the various EFEM configurations using a single FOUP purge configuration because of differences at the interface between the EFEM load port and the FOUP opening for different EFEMs.

FIG. 3 is a schematic drawing showing a known substrate container 12 docked on a load port 14 adjacent an equipment front end module (EFEM) 18. The substrate container 12 may be any front opening substrate carrier such as, for example, a front opening unified pod (FOUP), a front opening shipping box (FOSB), or a multi-application carrier (MAC). For the purpose of simplicity, discussions of failings of known systems, as well as discussions of the embodiments described herein are described in the context of a FOUP, as shown in FIGS. 1-3. However, it will be generally understood by those of skill in the art that many of the concepts disclosed herein may have applicability to other substrate containers or carriers and more particularly other front opening substrate containers or carriers.

In use, the substrate container 12 is docked on a load port, and the door (also sometimes referred to herein as a load port or a load port opening) of the EFEM 18 is opened. Next, the door is disengaged from the substrate container 12 which permits a robotic arm housed within the EFEM 18 to access the semiconductor wafers W contained within the substrate container 12 for processing. Gas (e.g. nitrogen or extra clean dry air) flows through the EFEM 18 in a direction from a top 22 of the EFEM to a bottom 26 of the EFEM, as indicated by the arrows in FIG. 3. When the front opening 30 of the substrate container 12 interfaces with the load port opening 34 of the EFEM 18 creating a FOUP-EFEM interface, some of the gas flowing through the EFEM 18 and across the load port opening 34 may be inadvertently directed into the interior 38 of the container 12, potentially interfering with the purging capabilities of the substrate container 12 by temporarily causing an increase in the relative humidity and/or oxygen levels within the microenvironment of substrate container 12, which can be undesirable. In addition, not all EFEMs have the same construction. The size and dimension of the EFEMs as well as the internal structure of the EFEMs can vary depending upon the manufacturer. The variability in size and construction between EFEMs of different manufactures may create differences in the purge performance of the substrate container 12 when the substrate container 12 is utilized with different EFEMs.

SUMMARY

The disclosure relates generally to automation equipment used to process silicon wafers and other substrates for the semiconductor manufacturing industry, and more particularly, to a fixture for modifying gas flow inside an equipment front end module used in the processing of various substrates including silicon wafers.

In one illustrative embodiment, a flow modification fixture for modifying gas flow inside an equipment front end module used in the processing of silicon wafers includes a sheet of material configured to be positioned within and above an opening of an equipment front end module. The sheet of material can include a plurality of apertures or it can be a solid sheet of a polymeric or metallic material. In some cases, the sheet of material is a mesh having a plurality of apertures of uniform shape and dimension. The sheet of material has a first side that is sized to extend along the opening of the EFEM when the sheet of material is positioned adjacent an interior wall and a second side that extends in a direction away from the interior wall of the EFEM and into the EFEM interior. The first side has a first dimension that is equal to or greater than a width of the EFEM opening and the second side has a second dimension that is sufficient to modify gas flowing inside the equipment front end module when the second side extends into the EFEM interior.

In another embodiment, a flow modification fixture includes a sheet of material connected to an interior wall above an opening of an equipment front end module such that the sheet of material extends away from the interior wall into an interior of the equipment front end module at an angle. The sheet of material has a first side that is sized to extend along the opening of the equipment front end module and a second side that extends into the interior of the equipment front end module. The first side has a first dimension that is at least equal to a width of a load port opening of the equipment front end module, and the second side has a second dimension that is sufficient to modify gas flowing inside the equipment front end module when the sheet of material extends into the equipment front end module interior.

In yet another embodiment, a flow modification feature for modifying gas flow inside an equipment front end module used in the processing of silicon wafers includes a metal mesh fixture configured to be connected to an interior wall and above an opening of an equipment front end module. The metal mesh fixture includes a first portion positioned adjacent a second portion at a ninety degree angle. The first portion is sized to extend along the opening of the equipment front end module and the second portion is sized to extend into the equipment front end module interior at a distance that is sufficient to modify gas flowing inside the equipment front end module.

In still yet another embodiment, an equipment front end module includes a flow modification feature projecting away from an interior wall of the equipment front end module and into an interior of the equipment front end module at an angle. The flow modification feature modifies a flow of gas flowing from a top to a bottom of the equipment front end module across an opening of the equipment front end module.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings.

FIGS. 21A-21C show the pre and post scan maps for each particle test configuration.

Figure 1:
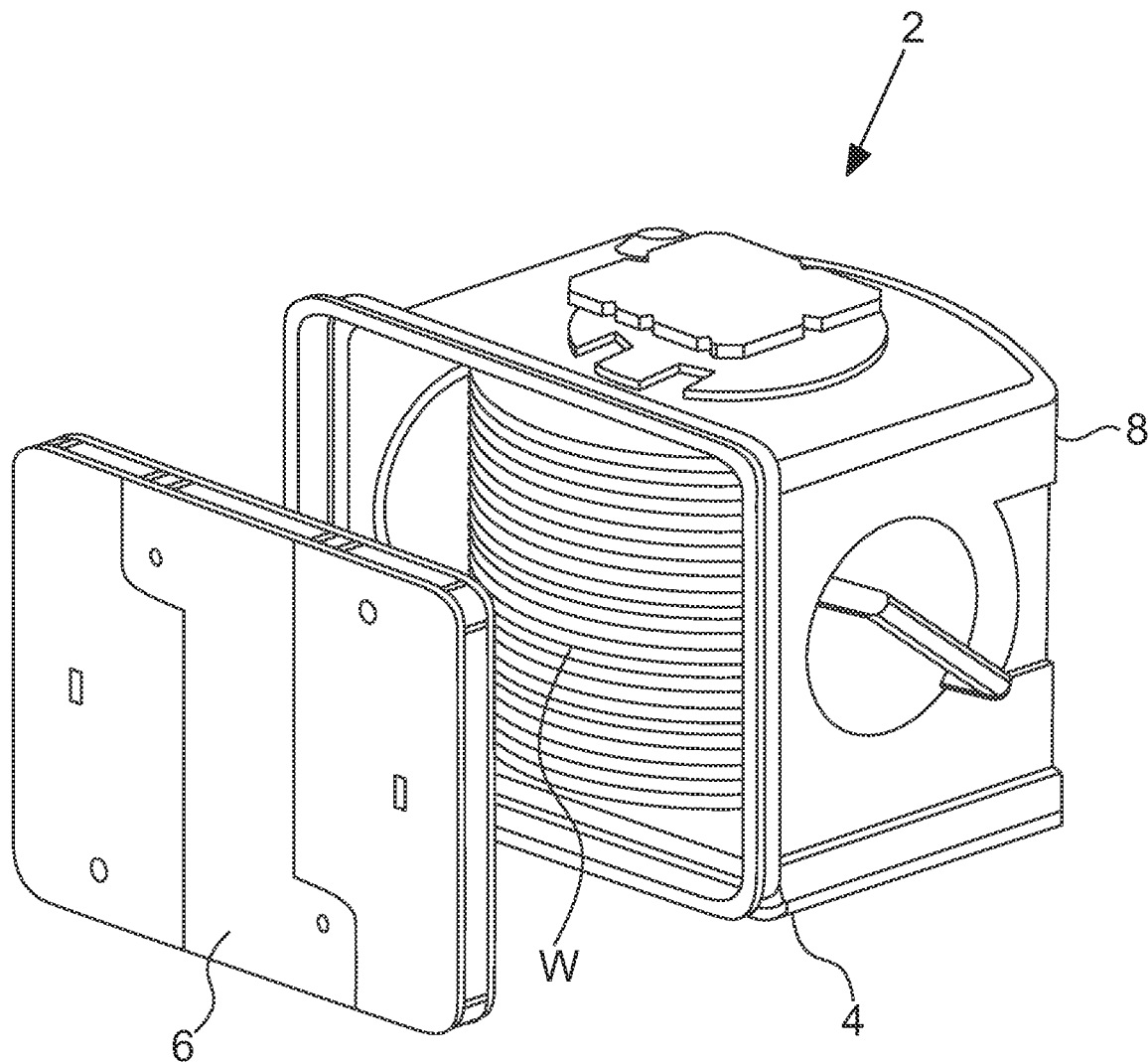
FIG. 1 shows a known front opening wafer container.
Figure 2:
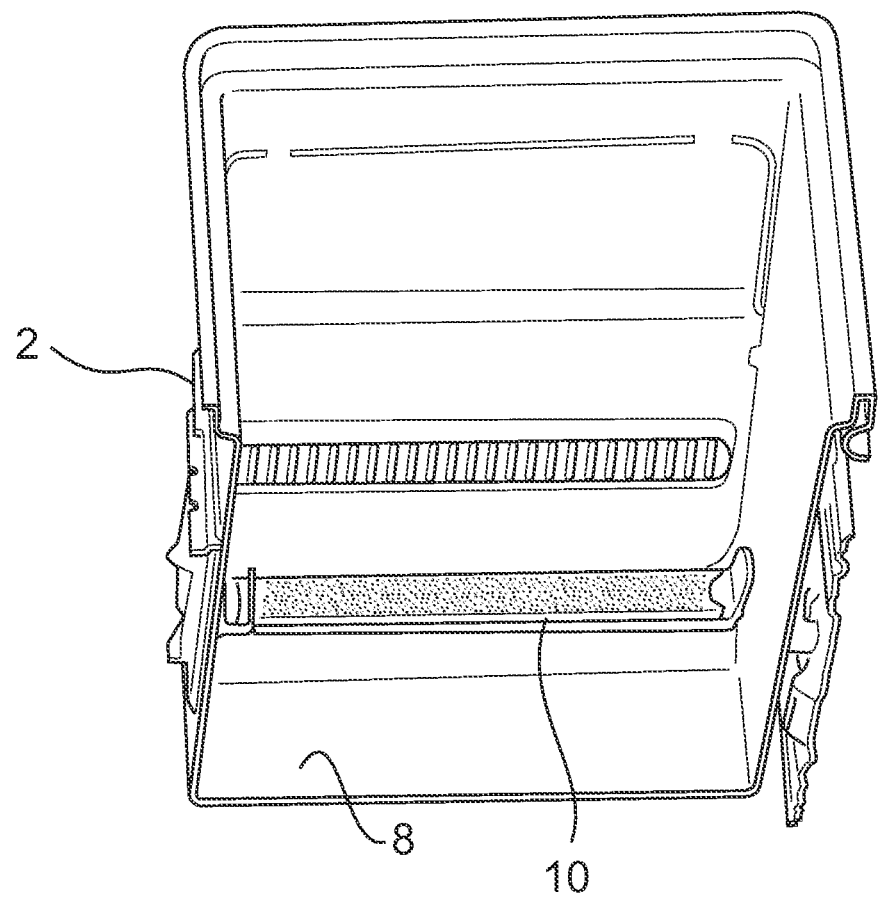
FIG. 2 shows a known front opening wafer container including a purge tower.
Figure 3:
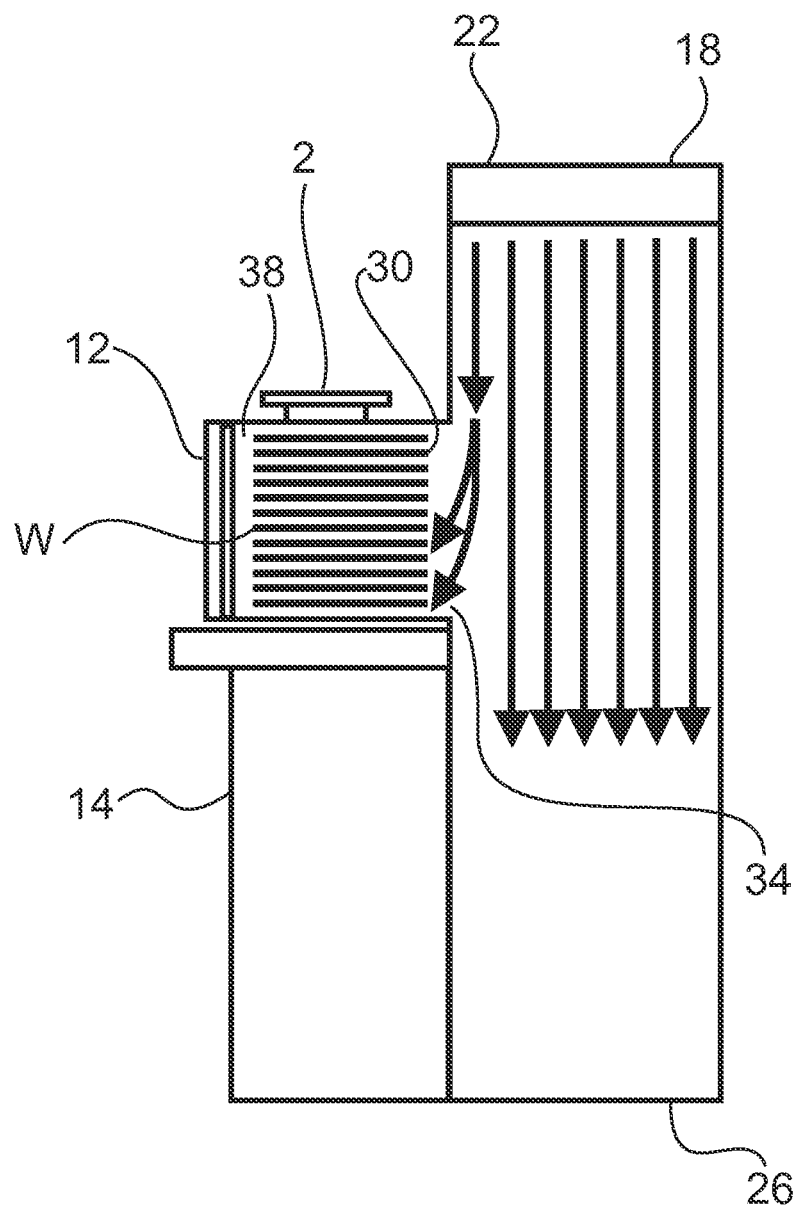
FIG. 3 is a schematic illustration of a known front opening wafer carrier interacting with an equipment front end module.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

As a mitigation of the aforementioned problems, according to various embodiments of the disclosure, an EFEM 118, 218 can include a flow modification feature that modifies the flow of gas flowing within the EFEM 118, 218 and more particularly, modifies the flow of gas flowing across the load port opening 34 of the EFEM 118, 218 at the FOUP-EFEM interface. Providing a flow modification feature that modifies the flow of gas flowing within an EFEM, such as for example, EFEM 118, 218, may enhance the purge performance of a FOUP or other substrate container docked at the load port and/or make uniform the purge performance of a given FOUP when it is utilized with different EFEMs from different manufacturers. In addition, a lower purge gas flow rate within the FOUP can be used when the FOUP is docked at an EFEM having a flow modification feature.

Figure 4A:
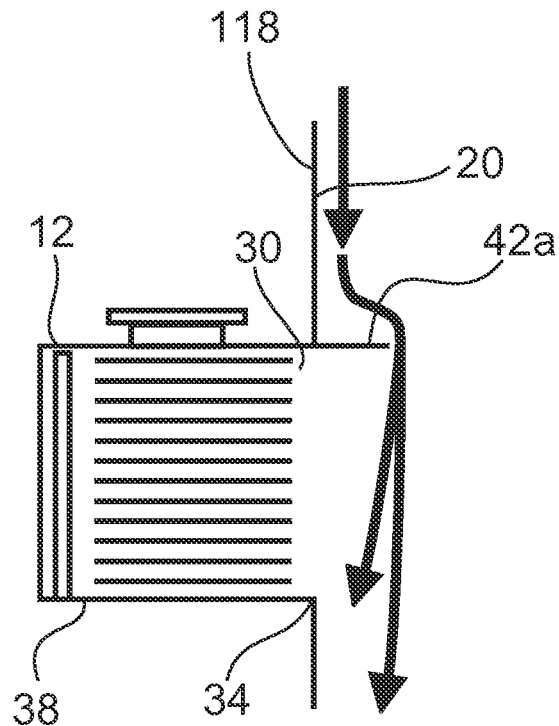
FIGS. 4A and 4B are close-up schematic illustrations of the interaction between a front opening wafer container and an equipment front end module in accordance with an embodiment of the disclosure.
Figure 4B:
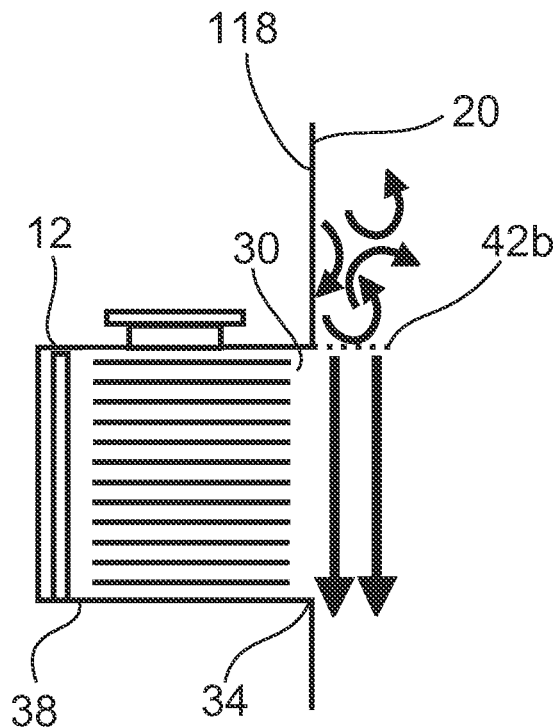

FIGS. 4A and 4B show schematic views of a front opening 30 of a substrate container 12 such as, for example, a FOUP, interfacing with a load port opening 34 of EFEM 118 that includes a flow modification fixture 42a, 42b. The flow modification fixture 42a, 42b can be positioned anywhere within the EFEM so long as it modifies the flow of gas flowing past the load port opening 34. As shown in FIGS. 4A and 4B, the flow modification fixture 42a, 42b can be positioned adjacent and in contact with the interior wall 20 at or above a load port opening 34 of the EFEM 118. In some cases, the flow modification fixture 42a, 42b is positioned slightly above the load port opening 34. In other cases, the flow modification fixture 42a, 42b can positioned such that the fixture 42a, 42b extends below an upper wall 36 of the load port opening 34. Additionally, the flow modification fixture 42a, 42b is positioned within the EFEM 118 such that it extends away from the interior wall 20 and into the interior of the EFEM 118 to modify the flow of gas flowing within the EFEM 118 and more particularly, to modify the flow of gas past the load port opening 34. In some embodiments, the flow modification fixture 42a, 42b may be positioned at a ninety degree angle α relative to the interior wall 20 of the EFEM 118. In other embodiments, the flow modification fixture 42a, 42b, may be positioned at an angle ranging from about 90 to about 170 degrees relative to the interior wall 20 of the EFEM. The flow modification fixture 42a, 42b can be integrally formed with an interior wall of the EFEM 118. Alternatively, as will be described in greater detail herein, the flow modification fixture 42a, 42b, can be provided as a separate element that is physically connected to the interior wall of the EFEM 118.

In some embodiments, as shown in FIG. 4A, the flow modification fixture 42a can be a flow deflection element that deflects gas flow away from the EFEM opening 34 and away from the FOUP-EFEM interface, delaying entry of the gas flow into the interior 38 of the container 12. In other embodiments, as shown in FIG. 4B, the flow modification fixture 42b is a laminar flow element having a plurality of apertures or openings that makes laminar the turbulent flow of gas flowing past the EFEM opening 34 and consequently, the FOUP-EFEM interface. A laminar gas flow across the EFEM opening can also delay and/or decrease the amount of gas entering the FOUP 12 from the EFEM 118.

The openings forming the laminar flow element can be of varying size and shape and can include circular openings, polygonal shaped openings (e.g. squarer, rectangle, diamond, hexagonal, etc.). In some case, the openings can have a uniform size and shape and can be evenly distributed over at least a portion of the surface area of the sheet of material from which the laminar flow element is formed. In other cases, the openings can vary in size and/or the number of openings provided in the sheet of material can vary along a length of the laminar flow element. For example, in some embodiments, the number of openings provided in the laminar flow element may be greatest in a middle section of the flow element. In other cases, only the middle section of a flow element may be provided openings.

Additionally, in certain cases, the flow modification fixture can combine features of a flow deflector element and a laminar flow element.

Figure 5A:
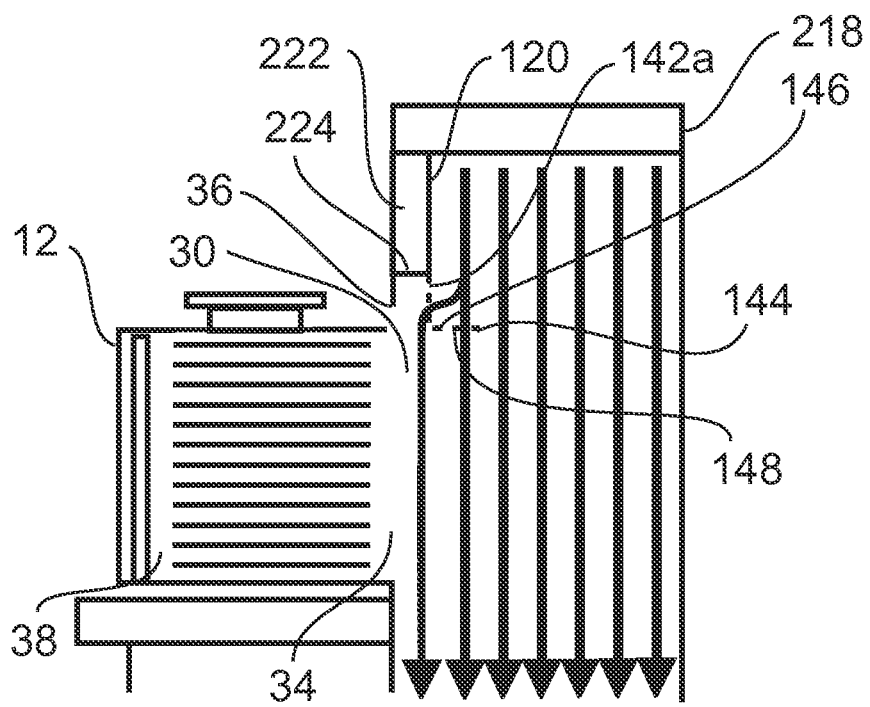
FIGS. 5A-5C are close-up schematic illustrations of the interaction between a front opening wafer container and an equipment front end module in accordance with an embodiment of the disclosure.
Figure 5B:
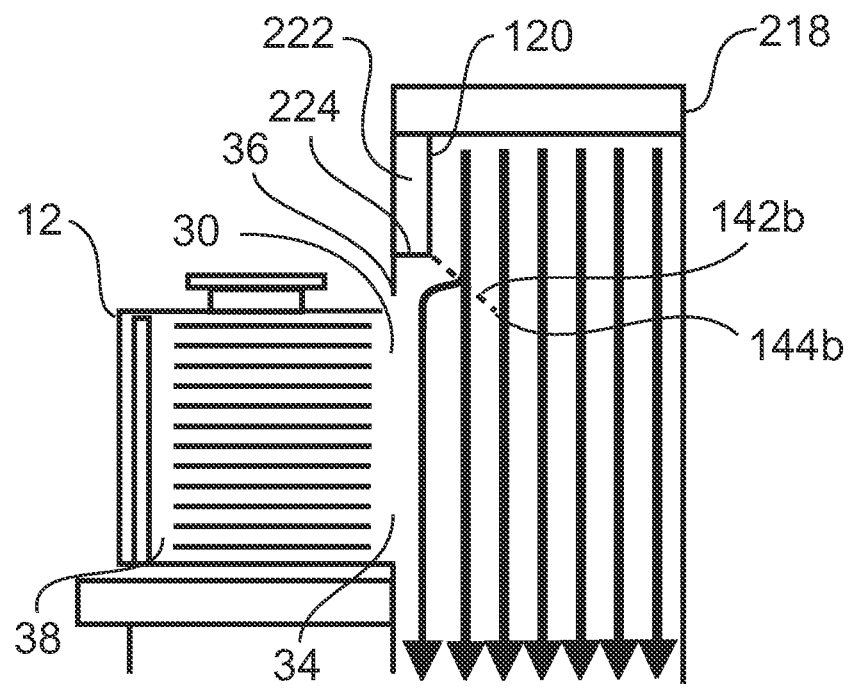
Figure 5C:
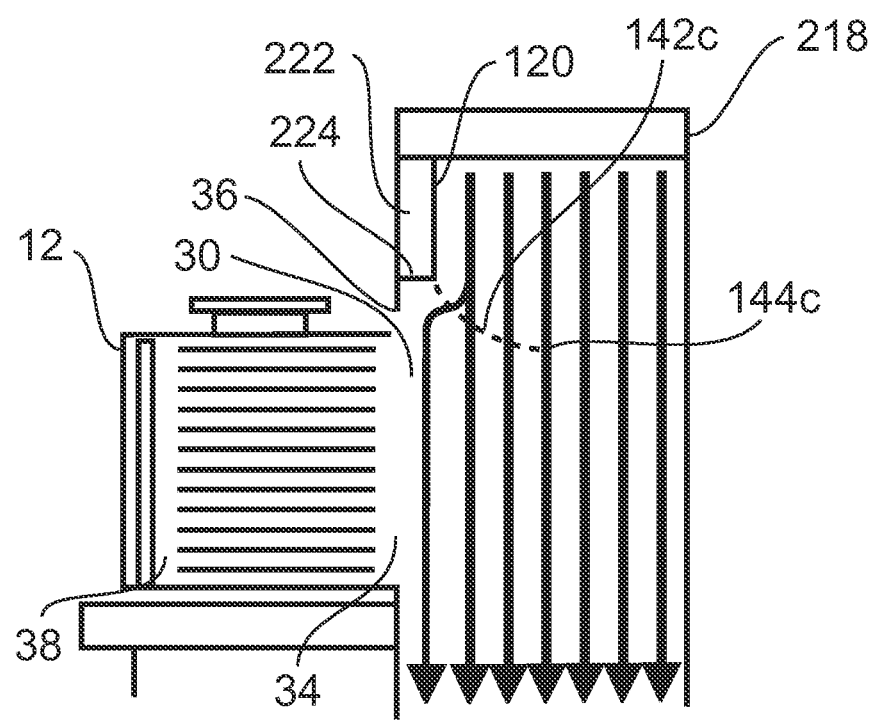

In some cases, certain EFEMs can have an internal structure or a frame that creates an overhang above the EFEM opening 34. FIGS. 5A-5C show schematic views of a front opening 30 of a container 12 interfacing with a load port opening 34 of EFEM 218 that includes an overhang 222. A flow modification fixture 142a, 142b, 142c extends from the overhang 222 such that it extends into the EFEM 218 to modify the flow of gas flowing within the EFEM 218 and more particularly, modifies the flow of gas flowing across the load port opening 34 of the EFEM 218 at the FOUP-EFEM interface.

The flow modification fixture 142a-142c can be integrally formed with an interior wall 120 of the EFEM 218. Alternatively, as will be described in greater detail herein, the flow modification fixture 142a-142c can be provided as a separate element that is physically connected to the interior wall 120 of the EFEM 218. The flow modification fixture 142a-142c can be either a laminar flow element or a flow deflector element as described herein according to the various embodiments. In some cases, the flow modification fixture 142a-142c can combine features of a flow deflector element and a laminar flow element.

As shown in FIGS. 5A-5C, the flow modification fixture 142a-142c is positioned adjacent to and in contact with an interior wall 120 of the EFEM 218 defined by the overhang 222. The flow modification fixture 142a-142c is positioned within the EFEM 218 such that it extends away from the interior wall 120 and a bottom 224 of the overhang 222 and into the interior of the EFEM 218 to modify the flow of gas flowing within the EFEM 218

Additionally, the flow modification fixture 142a-142c is positioned adjacent the overhang 222 at or above the load portion opening 34. In some cases, the flow modification fixture 142a-142c does not extend below an upper wall 36 of the EFEM opening 34. The flow modification fixture 142a-142c can be positioned at or above the load port opening 34 such that an end 144a-144c of the flow modification fixture is located between the upper wall 36 of the load port opening 34 and a bottom 224 of the overhang 222. The flow modification fixture 142a-142c can be positioned at or above the load port opening 34 such that an end 144a-144c of the flow modification fixture 142a-142c is located between the upper wall 36 of the opening 34 and the bottom 224 of the overhang 222 at a relative distance ranging from about five percent to about ninety five percent when measured from the upper wall 36 of the EFEM opening 34. The relative distance is defined as the distance measured from the upper wall 36 divided by the total distance measured between the upper wall 36 and a bottom 224 of the overhang 222 multiplied by one hundred. In other embodiments, an end 144a-144c of the flow modification fixture 142a-142c is located between the upper wall 36 of the opening 34 and the bottom 224 of the overhang 222 at a relative distance ranging from about ten percent to about ninety percent, from about ten percent to about eighty percent, from about ten percent to about sixty percent, from about ten percent to about forty percent, and from about ten percent to about twenty percent. In still other embodiments, the flow modification fixture 142a-142c can be positioned at or above the load port opening 34 such that an end 144a-144c of the flow modification fixture 142a-142c is located approximately halfway between the upper wall 36 of the opening 34 and a bottom 224 of the overhang 222. In still other embodiments, an end 144a-144c of the flow modification fixture 142a-142 may extend somewhat below the upper wall 36 of the opening 34 of the load port.

In some embodiments, as shown in FIG. 5A, the flow modification fixture 142a can be generally L-shaped such that it has a first portion 146 extending downward from the overhang 222 and a second portion 148 positioned at a ninety degree angle relative to the first portion 146 such that it extends into the interior of the EFEM 218. In other embodiments, the flow modification fixture 142b may be positioned at an angle greater than about ninety degrees relative to the interior wall 120 of the EFEM 218 such that it extends away from the overhang 222 in a downward direction, as shown in FIG. 5B. In still other embodiments, the flow modification fixture 142 may curve away from the bottom 224 of the overhang in a convex or a concave manner, a shown in FIG. 5C. When curved in such a manner, the flow modification fixture 142c may act as an airfoil, particularly if the flow modification fixture 142c is a solid element.

Figure 6A:
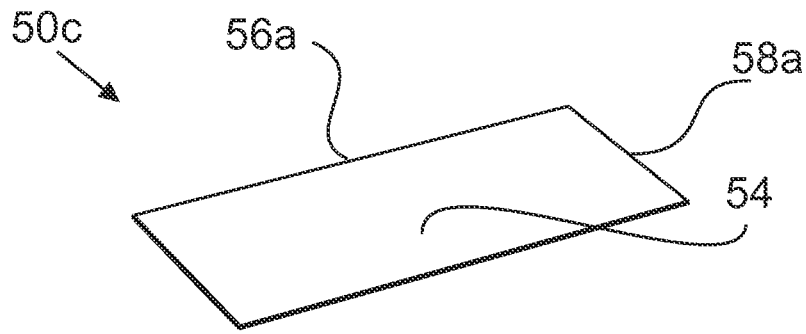
FIGS. 6A-6C are schematic views of various flow deflector elements in accordance with embodiments of the disclosure.
Figure 6B:
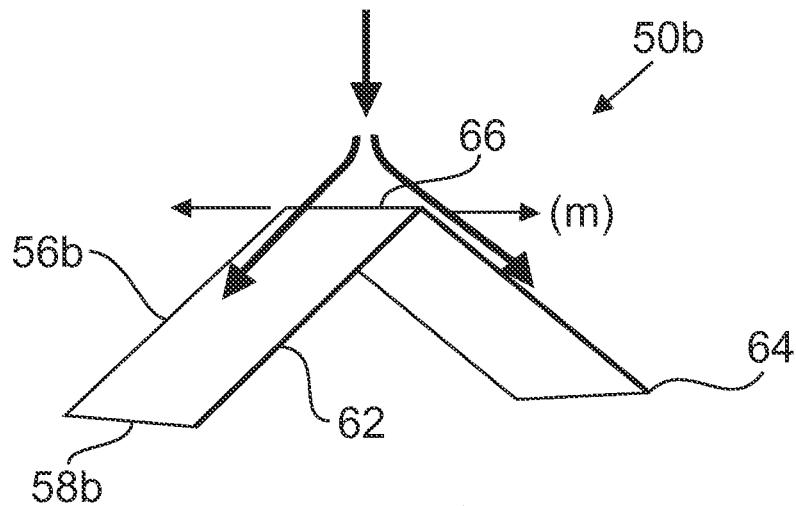
Figure 6C:
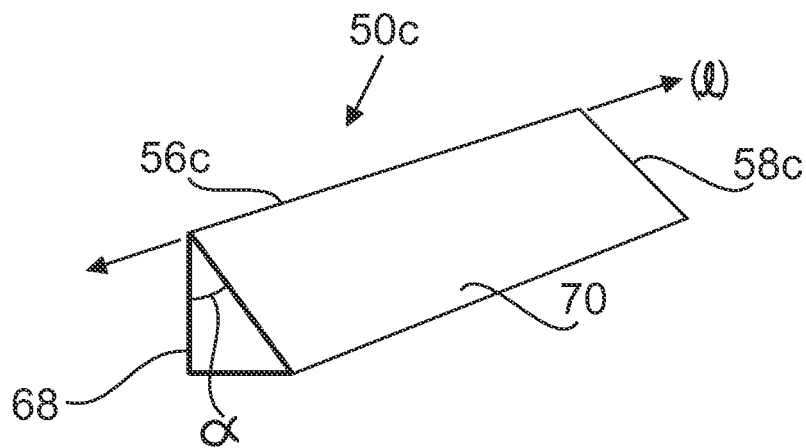

FIGS. 6A-6C are schematic views of various flow deflector elements 50a-50c that can be used to deflect gas flow away from an EFEM opening such as EFEM opening 34 shown in FIGS. 4A-5C. Deflecting gas away from the FOUP-EFEM interface and/or delaying entry of the gas flow into the interior of the FOUP may help to maintain desired relative humidity and oxygen levels within the open FOUP, which is desirable for increasing and/or maintaining a desired level of product yield from the wafers or substrates housed within the FOUP. As discussed herein, the flow deflector elements 50a-50c can be integrally formed with an interior wall of an EFEM or, alternatively, can be provided as a separate element that is connected to the interior wall of an EFEM using a variety of attachment means. Suitable attachment means can include brackets, screws, adhesives, magnets, and combinations of these. The flow deflector elements 50a-50c can be sized and dimensioned to according to the size and construction of a particular EFEM. In other words, the flow deflector elements can be customized according to the size, dimensions, and constructions (overhang or no overhang) or a particular EFEM. In some cases, the flow deflector elements 50a-50c are sized such that they extend along the entire width of a load port opening of a selected EFEM. The flow deflector elements 50a-50c can be sized such that they extend over at least a portion portion of the width of a load port opening or overhang. In some cases, the flow deflector elements 50a-50c can be sized such that they extend along the entire width of an overhang of a selected EFEM.

In one embodiment, as shown in FIG. 6A, the flow deflector element 50a can be a planar sheet 54 of a metallic or polymeric material having a first side 56a that is configured to extend along at least a portion of load port opening of an EFEM and a second side 58a that is configured to extend in a direction away from the interior wall of the EFEM and into the EFEM interior when the planar sheet of material 54 is positioned adjacent to and in contact with an interior wall of the EFEM and above a load port opening of the EFEM. In some cases, the first side 56a has a first major dimension that is equal to or greater than the width of the load port opening of the EFEM and the second side 58a has a second minor dimension that permits the second side to extend a sufficient distance into the EFEM interior so as to deflect the flow of gas away from the load port opening of the EFEM. In some cases, the second side 58a may extend a distance of at least about 0.25 inches (0.635 cm) up to about 4 inches (10.16 cm) into the EFEM interior when measured from the interior wall of the EFEM. In particular, the second side 58a may extend a distance of at least about 0.5 inches (1.27 cm) up to about 3 inches (7.62 cm), about 0.50 inches (1.27 cm) up to about 2 inches (7.62 cm), and more particularly, from about 0.50 inches (1.27 cm) up to about 1 inch (2.54 cm) into the EFEM interior when measured from the interior wall of the EFEM. In many cases, the first dimension of the first side 56a is greater than the second dimension of the second side 58a such that the planar sheet of material 54 has a generally rectangular shape. In some cases, the planar sheet of material is a solid sheet of stainless steel.

The flow deflector element 50a can be placed adjacent to the interior wall of the EFEM at an angle measured relative to interior wall of the EFEM as described herein with reference to 5A and 5B. In some cases, the flow deflector 50a can be placed adjacent to the interior wall of the EFEM at a 90 degree angle measured between an upper surface of the planar sheet of material and the interior wall of the EFEM. In other cases, the flow deflector element can be positioned adjacent to and in contact with the interior wall of the EFEM at an angle that ranges from 90 degrees to about 170 degrees measured between an upper surface of the planar sheet of material and the interior wall of the EFEM.

In another embodiment, as shown in FIG. 6B, the flow deflector element 50b can include a first portion 62 and a second portion 64. The first portion 62 can be positioned at an angle relative to the second portion 64 along a minor axis (m) of the flow deflector element 50b. Additionally, the flow deflector element 50b includes a first side 56b that is configured to extend along a load port opening of an EFEM and a second side 58b that is configured to extend in a direction away from the interior wall of the EFEM and into the EFEM interior when the flow deflector element 50b is positioned adjacent an interior wall of the EFEM and above a load port opening of the EFEM. In the embodiment shown in FIG. 5B, the first side 56b has a first dimension greater than the width of the load port opening of the EFEM, thus accommodating the angled first and second portions 62, 64 positioned adjacent the interior wall of the EFEM. In this embodiment, the flow deflector element 50b is configured such that it may be braced against or otherwise supported by two opposing interior walls of the EFEM with the first side 56b positioned against the interior wall including the load port opening. In use, gas flowing downward within the EFEM strikes the apogee 66 of the flow deflector element 50b. The apogee 66 of the flow deflector 50b elements diverts the gas flow in two different directions, as depicted by the arrows in FIG. 6B, such that gas the flows away from the left and right sides of the load port opening (e.g. load port opening 34 shown in FIGS. 4A-5C). Diverting gas flow away from the sides of the load portion opening 34 may be another useful way to deflect gas away from the FOUP-EFEM interface and/or delay entry of the gas flow into the interior of a FOUP docked at the load port. While shown with a distinct apogee 66, it is also envisioned that the flow deflector element 50b could be rounded in a generally semicircular shape.

FIG. 6C shows yet another embodiment of a deflector element 50c. Similar to the flow deflector elements 50a, 50b discussed above with reference to FIGS. 6A and 6B, the flow deflector element 50c includes a first side 56c that is configured to extend at least partially along a width a load port opening of an EFEM and a second side 58c that is configured to extend in a direction away from the interior wall of the EFEM and into the EFEM interior when the flow deflector element 50c is positioned adjacent an interior wall of the EFEM. In the embodiment shown in FIG. 5C, the flow deflector element 50c also includes a first portion 68 positioned at an angle relative to a second portion 70 along a major axis (1) of the deflector element 50c. The angle α measured between the first portion 68 and the second portion 70 can be be less than about ninety degrees. In some cases, the angle α measured between the first portion 68 and the second portion 70 is about 45 degrees. In this embodiment, the first portion 68, including the first side 56c, is configured to be positioned adjacent to and in contact with an interior wall of an EFEM such that the second portion 70 extends away from the interior wall and into the interior of the EFEM at the angle measured between the first portion 68 and the second portion 70. In some cases, the first portion 68 can be positioned adjacent the interior wall and above a load portion opening of the EFEM such that the second portion 70 extends at a downward angle into the EFEM interior. In other cases, the first portion 68 can be positioned adjacent an interior wall and above a load port opening of the EFEM such that the second portion 70 extends at an upward angle into the EFEM interior. In addition, in some cases, the first side 56c has a first dimension that is equal to or greater than the width of the load port opening of the EFEM and the second side 58c has a second dimension that permits the second side to extend a sufficient distance into the EFEM interior so to deflect the flow of gas away from the load port opening of the EFEM even when the second portion 70 is positioned at an angle relative to the first portion 68. In some cases, the second side 58c may extend a distance of at least about 0.25 inches (0.635 cm) up to about 4 inches (10.16 cm) into the EFEM interior when measured from the interior wall of the EFEM. In particular, the second side 58c may extend a distance of at least about 0.5 inches (1.27 cm) up to about 3 inches (7.62 cm), about 0.50 inches (1.27 cm) up to about 2 inches (7.62 cm), and more particularly, from about 0.50 inches (1.27 cm) up to about 1 inch (2.54 cm) into the EFEM interior when measured from the interior wall of the EFEM.

Figure 7A:
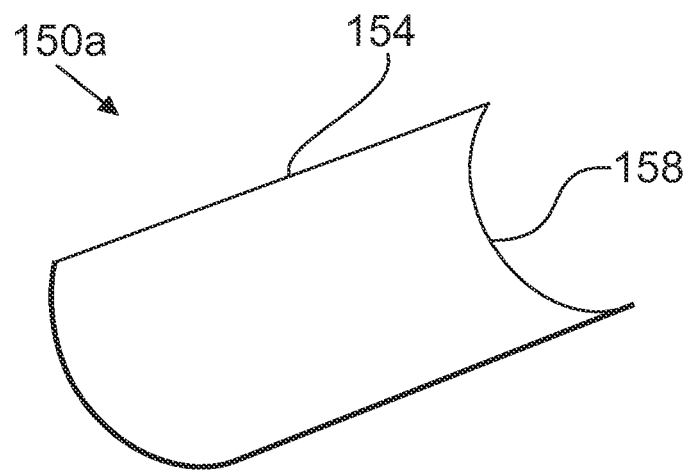
FIGS. 7A and 7B are schematic views of other flow deflector elements in accordance with embodiments of the disclosure.
Figure 7B:
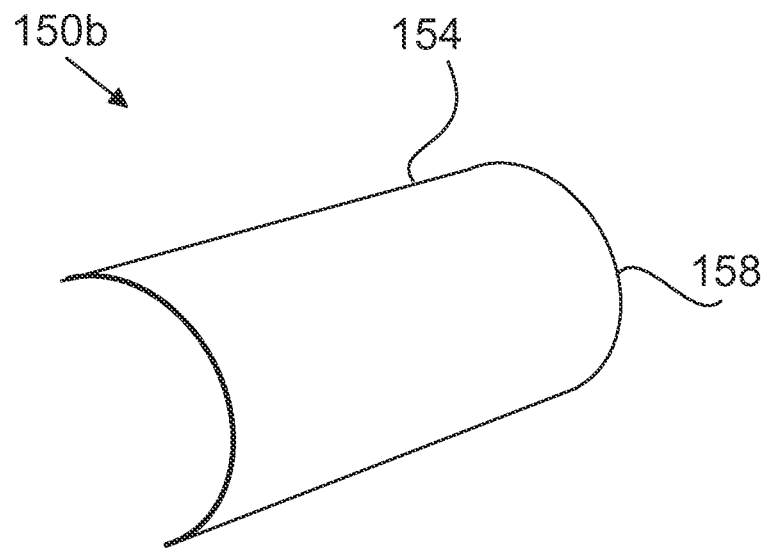

FIGS. 7A and 7B show other embodiments of a flow deflector 150a, 150b. In the embodiments depicted by FIGS. 7A, 7B, the flow deflector elements 150a, 150b are curved and, in some cases, may act as an airfoil deflecting gas flow away from the load port opening and the FOUP-EFEM interface. Each of the flow deflector elements 150a, 150b has a first side 154 that is sized and dimensioned to extend at least partially along a load port opening of an EFEM and a second side 158 that is configured to extend in a direction away from the interior wall of the EFEM and into the EFEM interior when the flow deflector element 150a, 150b is positioned adjacent an interior wall of the EFEM. In the embodiment depicted in FIG. 7A, the flow deflector element 150a is curved in a concave manner. In the depiction shown in FIG. 7B, the flow deflector 150b is curved in a convex manner. The flow deflector elements 150a, 150b may be fabricated from solid sheet of a metal or plastic material. In some embodiments, the flow deflector elements 150a, 150b are fabricated from a solid sheet of stainless steel.

Figure 8A:
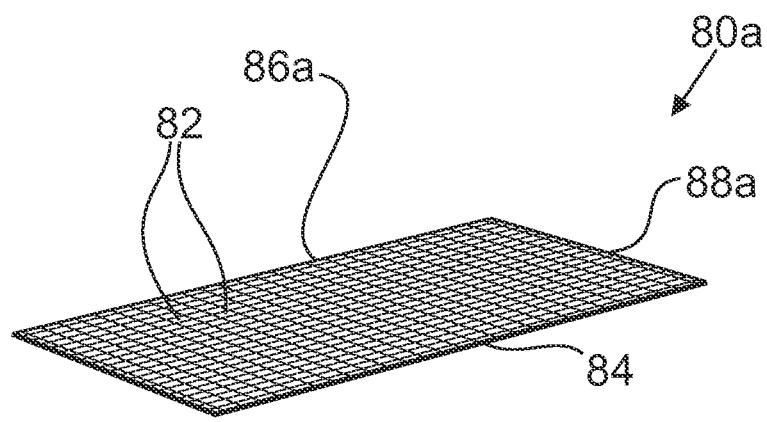
FIGS. 8A-8C are schematic views of various laminar flow elements in accordance with embodiments of the disclosure.
Figure 8B:
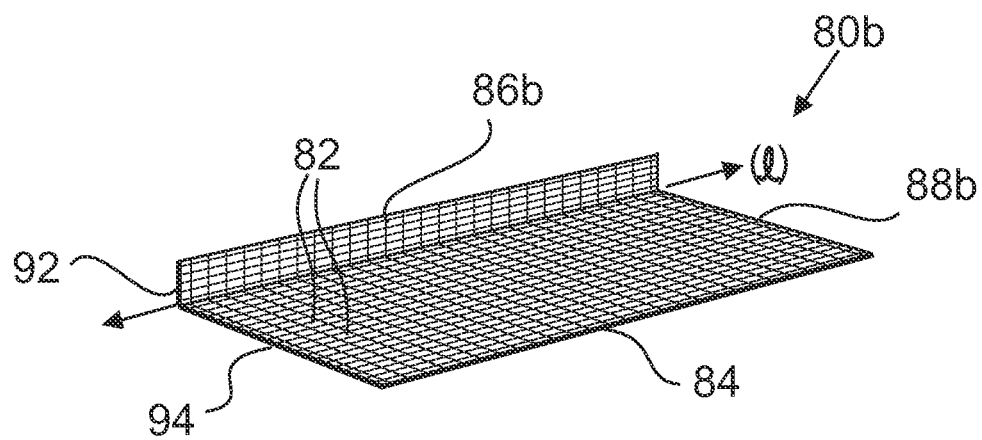
Figure 8C:
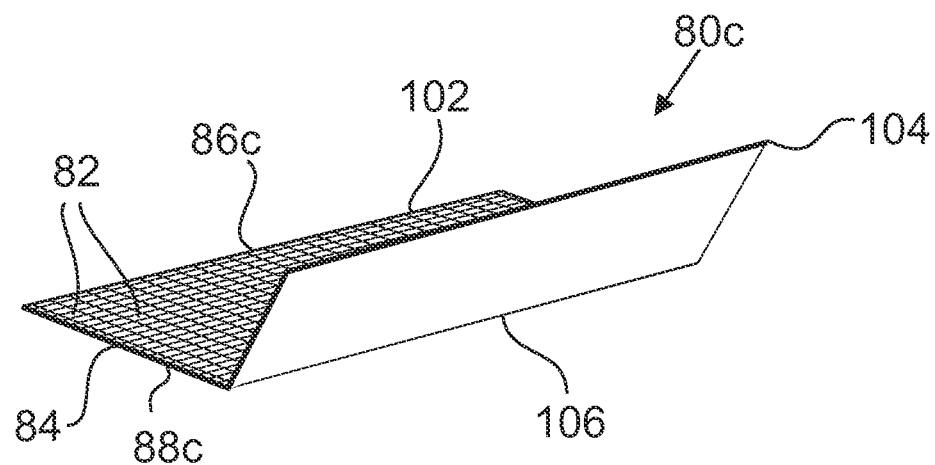

FIGS. 8A-8C are schematic views of various laminar flow elements 80a-80c that may be used to make laminar the turbulent flow of gas flowing across an EFEM opening. Laminarizing gas flow at the FOUP-EFEM interface may decrease the amount of gas that enters the open FOUP and may help to maintain desired relative humidity and oxygen levels within the open FOUP, which is desirable for increasing and/or maintaining a desired level of product yield from the wafers or other substrates housed within the FOUP. As discussed herein, the laminar elements 80a-80c can be integrally formed with the interior wall of an EFEM or, alternatively, can be provided as a separate element that is connected to the interior wall of an EFEM using a variety of attachment means. Suitable attachment means can include brackets, screws, adhesives, magnets and combinations thereof.

In one embodiment, as shown in FIG. 8A, the laminar flow element 80a can be a planar sheet 84 of a metallic or polymeric material including a plurality of apertures or openings 82 that make laminar the flow of gas through the laminar flow element 80a. The openings 82 forming the laminar flow element 80a can be of varying size and shape and can include circular openings, polygonal shaped openings (e.g. square, rectangle, hexagonal, octagonal, etc.), slots or slits. The openings 82 can have a uniform size and shape and can be evenly distributed over at least a portion of a surface area of the sheet of material 84 from which the laminar flow element 80a is formed. In some cases, the openings 82 are distributed over at least 25 percent of the surface area of the sheet of material 84 from which the laminar flow element 80a is formed and more particularly, over at least 50 percent up to 100 percent of the surface area of the sheet of material 84 from which the laminar flow element 80a is formed. In other cases, the openings 82 can vary in size and/or the number of openings provided in the sheet of material 84 can vary along a length of the laminar flow element 80a. For example, in some embodiments, the number of openings 82 provided in the laminar flow element 80a may be greatest in a middle section of the flow element 80a.

In one embodiment, the laminar flow element is formed from a mesh having a uniform shape and dimension. The mesh can be a woven mesh or it can be a perforated mesh. The mesh size can be selected based on the particular EFEM, the internal structure of the EFEM, and the conditions within the EFEM such as the velocity of the gas flowing within the EFEM. For a woven mesh, the mesh size is often a variant of the diameter of the wire or filament used to form the mesh. Regardless of the wire diameter, mesh size can be defined as the number of openings per linear inch. A lower mesh size (e.g size 2 or 4) has larger openings and is appropriate for a higher velocity of gas flow within the EFEM. A higher mesh size (e.g. 10 or 12) has smaller openings and is more appropriate for a lower velocity of gas glow within the EFEM. In some cases, the mesh size used to form at least a portion of the laminar flow elements 80a-80c, shown in FIGS. 8A-8c, can range from 2 to 40 openings per linear inch. In other cases the mesh size can range from 6 to 12 openings per linear inch and more particularly, from 8 to 10 openings per linear inch.

The mesh can be formed from a corrosion resistant metal or metal alloy. In some cases, the mesh is coated with a corrosion resistant coating. In one embodiment, the mesh is a stainless steel mesh.

The laminar flow element 80a a first side 86a that is configured to extend along at least a portion of a load port opening of an EFEM and a second side 88a that is configured to extend in a direction away from the interior wall of the EFEM and into the EFEM interior when the planar sheet of material 84 is positioned adjacent an interior wall of the EFEM and at or above a load port opening of the EFEM. In some cases, the first side 86a has a first dimension that is equal to or greater than the width of the load port opening of the EFEM and the second side 88a has a second dimension that permits the second side 88a to extend a sufficient distance into the EFEM interior so to make laminar the flow of gas within the EFEM and across the EFEM opening. In some cases, the second side 88*a* may extend a distance of at least about 0.25 inches (0.635 cm) up to about 4 inches (10.16 cm) into the EFEM interior when measured from the interior wall of the EFEM. In particular, the second side 88*a* can extend a distance of at least about 0.5 inches (1.27 cm) up to about 3 inches (7.62 cm), about 0.50 inches (1.27 cm) up to about 2 inches (7.62 cm), and more particularly, from about 0.50 inches (1.27 cm) up to about 1 inch (2.54 cm) into the EFEM interior when measured from the interior wall of the EFEM. In many cases, the first dimension of the first side 86*a* is greater than the second dimension of the second side 88*a* such that the laminar flow element 80*a* has a generally rectangular shape.

The laminar flow element 58*a* can be placed adjacent to the interior wall of the EFEM at an angle measured relative to interior wall of the EFEM as described herein with reference to 5A and 5B. In some cases, the laminar flow element 80*a* can be placed adjacent to the interior wall of the EFEM at a 90 degree angle measured between an upper surface of the planar sheet of material 84 and the interior wall of the EFEM. In other cases, the laminar flow element can be positioned adjacent to and in contact with the interior wall of the EFEM at an angle that ranges from 90 degrees to about 170 degrees measured between an upper surface of the planar sheet of material 84 and the interior wall of the EFEM.

In another embodiment, as shown in FIG. 8B, the laminar flow element 80*b* is formed from a material having a plurality of openings, as described herein with reference to FIG. 8A. In some cases, the laminar flow element 80*b* is formed from a metal mesh such, for example, a stainless steel metal mesh. The mesh size can range from 2 to 40 openings per linear inch, from 6 to 12 openings per linear inch and more particularly, from 8 to 10 openings per linear inch. The laminar flow element 80*b* can include a first side 86*b* that is configured to extend along a load port opening of an EFEM and a second side 88*b* that is configured to extend in a direction away from the interior wall of the EFEM and into the EFEM interior when the laminar flow element 80*b* is positioned adjacent to and in contact with an interior wall of the EFEM. In some cases, the first side 86*b* has a first dimension that is equal to or greater than the width of the load port opening of the EFEM and the second side 88*b* has a second dimension that permits the second side to extend a sufficient distance into the EFEM interior so as to make laminar the flow of gas within the EFEM. In some cases, the second side 88*b* may extend a distance of at least about 0.25 inches (0.635 cm) up to about 4 inches (10.16 cm) into the EFEM interior when measured from the interior wall of the EFEM. In particular, the second side 88*b* can extend a distance of at least about 0.5 inches (1.27 cm) up to about 3 inches (7.62 cm), about 0.50 inches (1.27 cm) up to about 2 inches (7.62 cm), and more particularly, from about 0.50 inches (1.27 cm) up to about 1 inch (2.54 cm) into the EFEM interior when measured from the interior wall of the EFEM.

In addition, as shown in FIG. 8B, the laminar flow element 80*b* includes a first portion 92 and a second portion 94. The first portion 92 can be positioned at an angle relative to the second portion 94 along a major axis (1) of the laminar flow element 80*b*. In some cases, the first portion 92 is positioned at an angle relative to the second portion 94 ranging from about 90 degrees to about 170 degrees. More particularly, the first portion 92 can be positioned at a 90 degree angle relative to the second portion 94 such that the laminar flow element 80*b* is generally L-shaped. In some cases, the first portion 92 can be used as a mounting flange to couple the laminar flow element 80*b* to an interior wall of an EFEM above the load port opening of the EFEM. While the first portion 92 is depicted as including a plurality of openings, alternatively it may be formed of a solid material.

FIG. 8C shows yet another embodiment of a laminar flow element 80*c*. Similar to laminar flow elements 80 and 80*b*, discussed herein, laminar flow element 80*c* can include a first side 86*c* that is configured to extend along a load port opening of an EFEM and a second side 88*c* that is configured to extend in a direction away from the interior wall of the EFEM and into the EFEM interior when the laminar flow element 80*c* is positioned adjacent an interior wall of the EFEM. The first side 86*c* has a first dimension that is equal to or greater than the width of the load port opening of the EFEM and the second side 88*c* has a second dimension that permits the second side to extend a sufficient distance into the EFEM interior so to make laminar the flow of gas within the EFEM. In many cases, the first dimension is greater than the second dimension. In addition, as shown in FIG. 8C, the laminar flow element 80*c* includes a laminar flow portion 102 formed of material having a plurality of openings, as described herein with reference to FIGS. 8A and 8B, and a guide plate portion 104 formed of a solid sheet of material. In some cases, the laminar flow portion 102 is formed from a metal mesh having opening of uniform shape and size. In one embodiment, the laminar flow portion 120 is formed from a stainless steel mesh having a mesh size ranging from 6 to 12 and more particularly from 8 to 10. The guide plate portion 104 may be coupled to a side 106 of the laminar flow element 80*c* that is located opposite the first side 86*c* such that the guide plate portion 104 is positioned away from the interior wall to which the laminar flow element 80*c* is attached and is located within the EFEM interior. When gas flow flowing in a downward direction from the top to the bottom of the EFEM hits the guide plate portion 104, the guide plate portion increases the flow velocity of the purge flow and directs the gas flow towards the laminar flow portion 102 of the laminar flow element 80*c*. In turn, this can increase flow velocity and make laminar gas flow across the load port opening and at the FOUP-EFEM interface. Increasing flow and/or laminarizing flow at the FOUP-EFEM interface may decrease the amount of gas that enters the open FOUP and may help to maintain desired relative humidity and oxygen levels within the open FOUP, which is desirable for increasing and/or maintaining a desired level of product yield from the wafers housed within the FOUP.

Figure 9A:
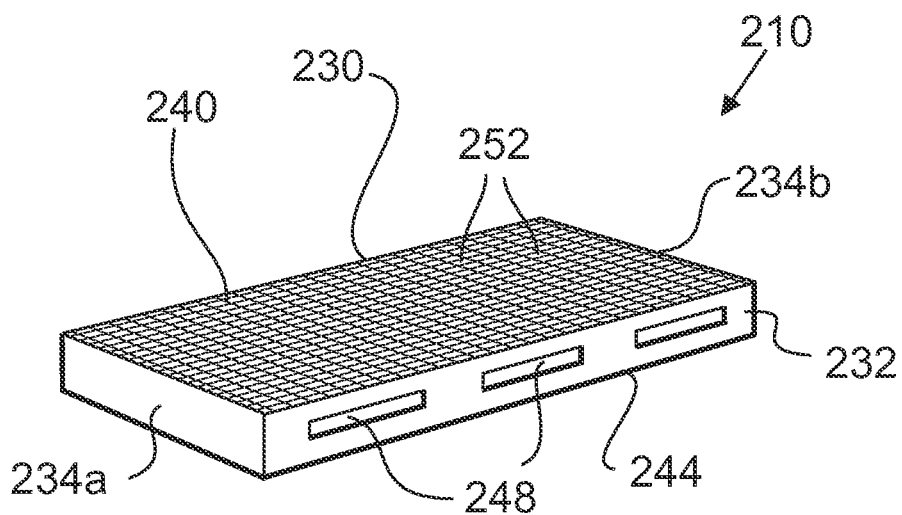
FIG. 9A-9B show perspective and end views of yet another laminar flow element in accordance with another embodiment of the disclosure.
Figure 9B:
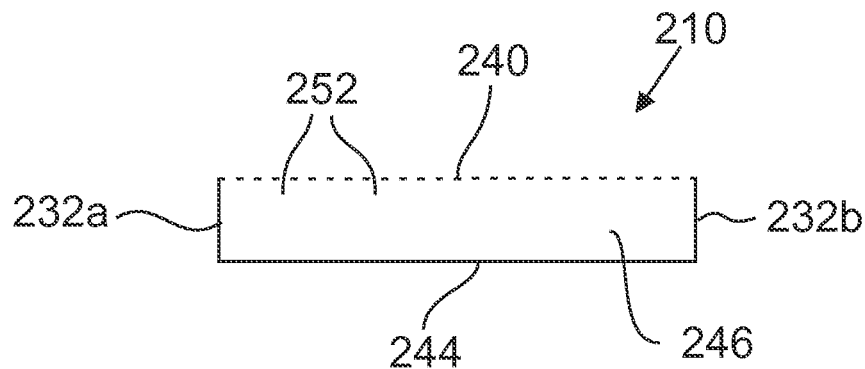
Figure 10:
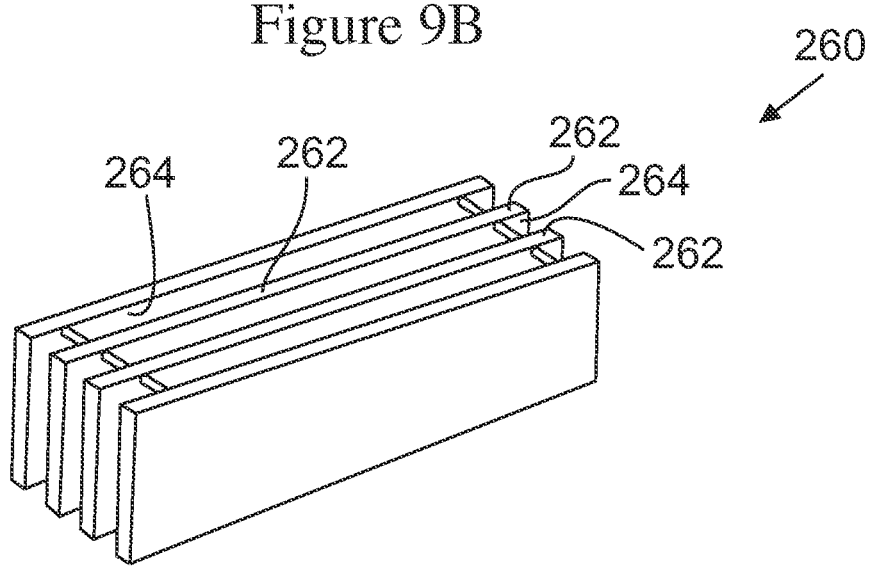
FIG. 10 is a schematic view of still another laminar flow element in accordance with the disclosure.

FIGS. 9A-9B show different views of yet another embodiment of a flow modification fixture 210. As shown in FIGS. 9A and 9B, the flow modification fixture 210 combines features of a flow deflector element and a laminar flow element. The flow modification fixture 210 includes a first side wall 230 that is configured to extend along a load port opening of an EFEM, a second side wall 232 opposite the first side wall 230 having one or more openings 248, and first and second end walls 234*a*, 234 that are configured to extend in a direction away from the interior wall of the EFEM and into the EFEM interior when the flow modification fixture 210 is positioned adjacent to and in contact with an interior wall of the EFEM. As shown, the flow modification fixture 210 is a three-dimensional fixture defined by first and second end walls 234*a*, 234*b*, first and second side walls 230, 232, and upper and lower surfaces 240, 244 that together define an interior 246 that permits the flow of gas between the upper and lower surfaces 240, 244. The upper surface 240 of the fixture 210 includes a plurality of openings 252 and the lower surface 244 is solid. A plurality of openings 248 are provided in at least one side wall 246 of the fixture 210 to allow gas to flow out of the interior space of the fixture 210. The size and shape of the openings 248, 253 can be selected based on the particular EFEM and the flow conditions within the EFEM. In some cases, the upper surface 240 is formed from a mesh having opening of a uniform size and shape. The openings 248 in the sidewall 232 can be slots or slit depicted in FIG. 9A. Alternatively, the side wall 232 can also be formed from a mesh having openings of a uniform size and shape. In use, gas flows through the openings 252 of the upper surface 240 of the fixture 210 and into the interior space. Within the interior space of the fixture 210, the gas flow is deflected by the solid lower surface 244, forcing the gas to escape from the interior space of the fixture 210 through the openings 248 in the side wall 232. The flow fixture 210 can be formed from a corrosion resistant metal or metal alloy and in some cases, can include a corrosion-resistant coating. In one embodiment, the flow fixture 210 is formed from stainless steel.

FIG. 11 shows a perspective view of still yet another embodiment of a flow modification fixture 260. Like the flow modification fixture 210 discussed above with reference to FIGS. 9A and 9B, the flow modification fixture 260 is also a three-dimensional fixture and includes a plurality of downwardly extending blades or fins 262 that are spaced apart from one another for laminarizing gas flow. Gas flowing within the EFEM flows within the voids 264 defined between each of the fins 262. In some cases, the blades or fins 262 are tapered towards a bottom of the individual fins 262. The distance between each of the fins 262 can be selected based on the particular EFEM and the conditions within the EFEM (e.g. gas flow velocity). For higher flow velocities within the EFEM, a flow modification fixture having a greater number of fins that are more closely spaced together may be selected. For an EFEM having a low flow velocity, a flow modification fixture having a fewer number of fins that are spaced apart from one another at a greater distance may be more appropriate. In some cases, the width of the individual fins can vary, and can affect the spacing between the fins and the number of fins. The flow modification fixture 260 can be formed from a variety of materials including corrosion resistant metal and metal alloys, and can include a corrosion resistant coating. In one embodiment, the flow modification fixture 260 is formed from stainless steel.

Figure 11A:
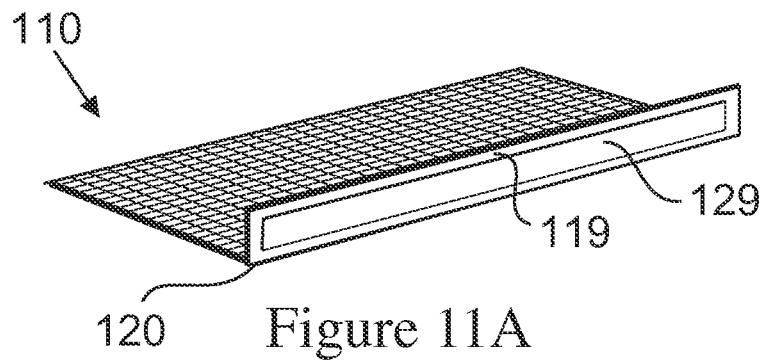
FIGS. 11A-11D are schematic views of flow modification fixtures including various attachment means in accordance with embodiments of the disclosure.
Figure 11B:
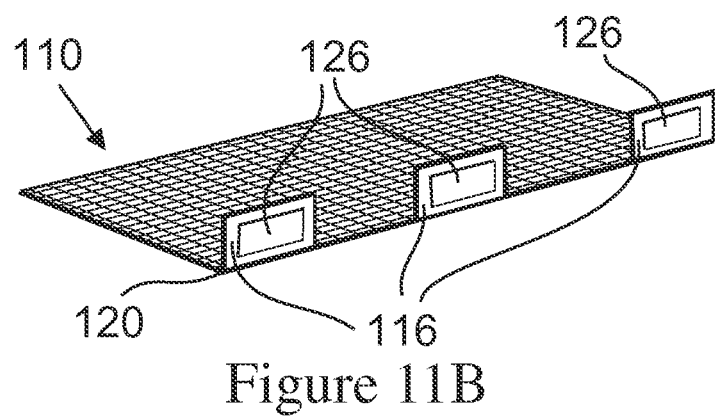
Figure 11C:
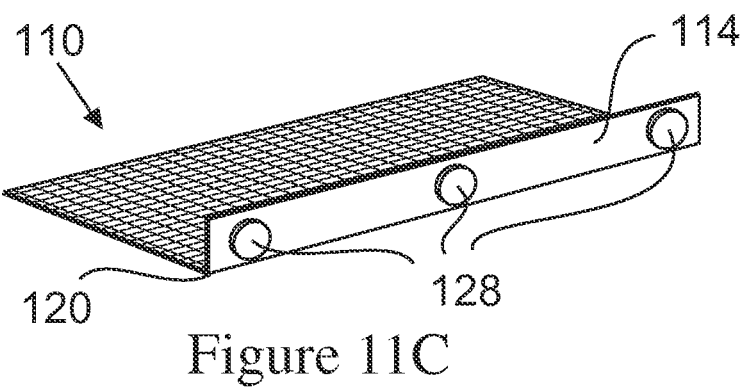
Figure 11D:
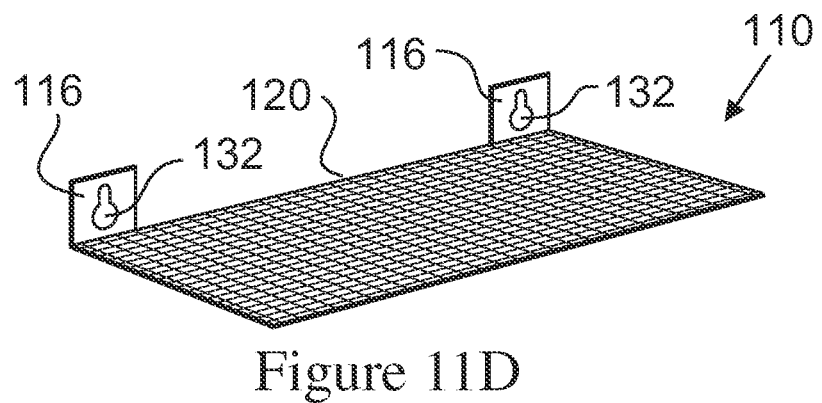

Various attachment means may be used to secure a flow modification fixture, as described herein according to the various embodiments, to an interior wall of an EFEM. Exemplary attachment means include adhesives, adhesive strips, magnets, brackets, screws, and/or the like. In some cases, as shown in FIGS. 11A-11D, the flow modification fixture 110 (shown as a laminar flow element) can include a mounting flange 114 (FIG. 11A and 11C) or a plurality of mounting tabs 116 (FIG. 11B and 11D) provided along the first side 120 of the fixture 110. In some cases, the mounting flange 114 and/or mounting tabs 116 can be integrally formed with the rest of the flow modification fixture. In other cases, they may be formed as separate elements and fused or welded to the flow modification fixture. Because they are not exposed to the gas flow, the mounting flange and/or tabs need not have the same material construction. For example, where the fixture is a laminar flow element including a metal mesh, the mounting flange and/or mounting tabs need not be formed of a mesh. Rather, they may be formed from a solid metal material. In some embodiments, an adhesive 124 may be provided on the back side of the mounting flange 114 (FIG. 11A) or mounting tabs 116 such that the fixture 110 may be adhesively attached to the interior wall of the EFEM. In other cases, magnetic elements 126 (FIG. 11B) may be secured to the back side of the mounting flange 114 or mounting tabs 116 so as to magnetically attract and secure the fixture 110 to the interior wall of the EFEM. In still other embodiments, as shown in FIG. 11C, one or more screws 128 or other fasteners may be used to secure the fixture 110 to the interior wall of the EFEM. In still yet other embodiments, the mounting flange 114 or tabs 116 may include one or more apertures 132 that may be configured to engage and receive a corresponding structure projecting outwards from the interior wall of the EFEM to which the fixture 110 is mounted.

EXAMPLES

The effect of a flow modification fixture on the purge performance of a SPECTRA™ FOUP, manufactured and marketed by Entegris, Inc., was evaluated under different purge conditions using two different equipment front end modules or load ports (EFEMs). The FOUP was loaded with twenty-five semiconductor wafers. Relative humidity sensors for measuring the relative humidity levels inside the FOUP were placed on wafer numbers 1, 13, and 25 at the front, back, right and left sides of the wafers. The percent relative humidity (% RH) levels at the different locations were recorded under different purging conditions (e.g. gas flow rate measured in liters per minute (1 pm) and gas) for the FOUP docked at each of the two EFEMS with and without a mesh flow modification element present within the EFEM interior. FIGS. 12-19 are graphs showing the test results for each of the purge performance tests carried out under the different conditions. The testing conditions associated with each test result displayed in FIGS. 12-19 are summarized in Table 1.

TABLE 1

| FIG. No. | Load Port | Gas | Flow Rate |
|---|---|---|---|
| 11 | Sinfonia LP | XCDA | 15 lpm/port |
| 12 | Sinfonia LP | XCDA | 20 lpm/port |
| 13 | Sinfonia LP | Nitrogen | 40 lpm/port |
| 14 | Sinfonia LP | Nitrogen | 50 lpm/port |
| 15 | Brooks LP | XCDA | 30 lpm/port |
| 16 | Brooks LP | XCDA | 40 lpm/port |
| 17 | Brooks LP | Nitrogen | 40 lpm/port |
| 18 | Brooks LP | Nitrogen | 50 lpm/port |

FIGS. 12-15 show the percent relative humidity (% RH) recorded at the front, left side, right side, and back of wafer numbers 1, 13, and 25 (hereinafter referred to as Wafer 1, Wafer 13, and Wafer 25) contained within a FOUP docked at a SINFONIA TECHNOLOGY™ Co., Ltd EFEM (Sinfonia LP). The percent relative humidity levels at the different locations were recorded under different purging conditions (e.g. gas flow rate and gas) with and without a mesh flow modification element present within the EFEM interior.

Figure 12:
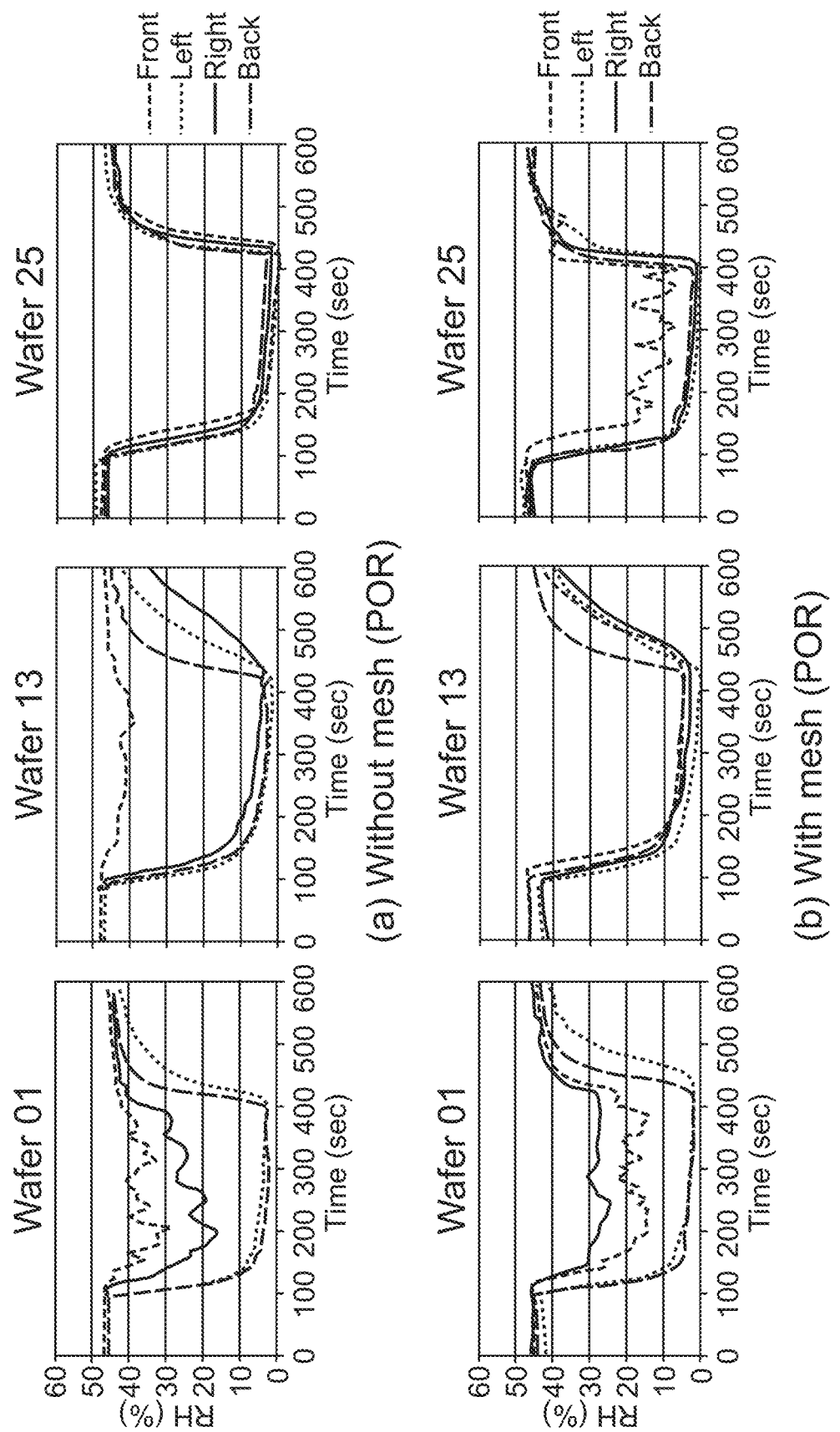
FIGS. 12-19 are graphs showing purge performance test results carried out under different purging conditions.

FIG. 12 shows the open door purge results recorded for a FOUP docked at an EFEM with extra clean dry air (XCDA) flowing within the EFEM at a flow rate of 15 lpm/port. The percent relative humidity (% RH) inside the FOUP was recorded at the front, left side, right side, and back of Wafer 1, Wafer 13 and Wafer 25 located inside the FOUP. FIG. 12 shows that the percent relative humidity (% RH) measured at the front and right side of Wafer 1 located inside the FOUP is decreased when a mesh laminar flow element is present within the EFEM (Sinfonia LP). A similar decrease in percent relative humidity (% RH) is observed at the front of Wafer 13. Wafer 13 is located in the approximate middle of the FOUP. No significant change in the percent relative humidity is observed at Wafer 25.

Because of its location at the top of the FOUP, Wafer 1 is the most likely wafer to be affected by the deflection of gas into the FOUP and also the turbulent flow of gas flowing past the FOUP opening. As such, the most significant reduction in the percent relative humidity is observed at Wafer 1. Wafer 25, located at the bottom of the FOUP, is least likely to be affected by the deflection of gas into the FOUP and also the turbulent flow of gas flowing past the FOUP opening. As such, it is not surprising that no significant change in the present relative humidity was observed at the various locations (e.g. front, left, right and back) of Wafer 25.

Figure 13:
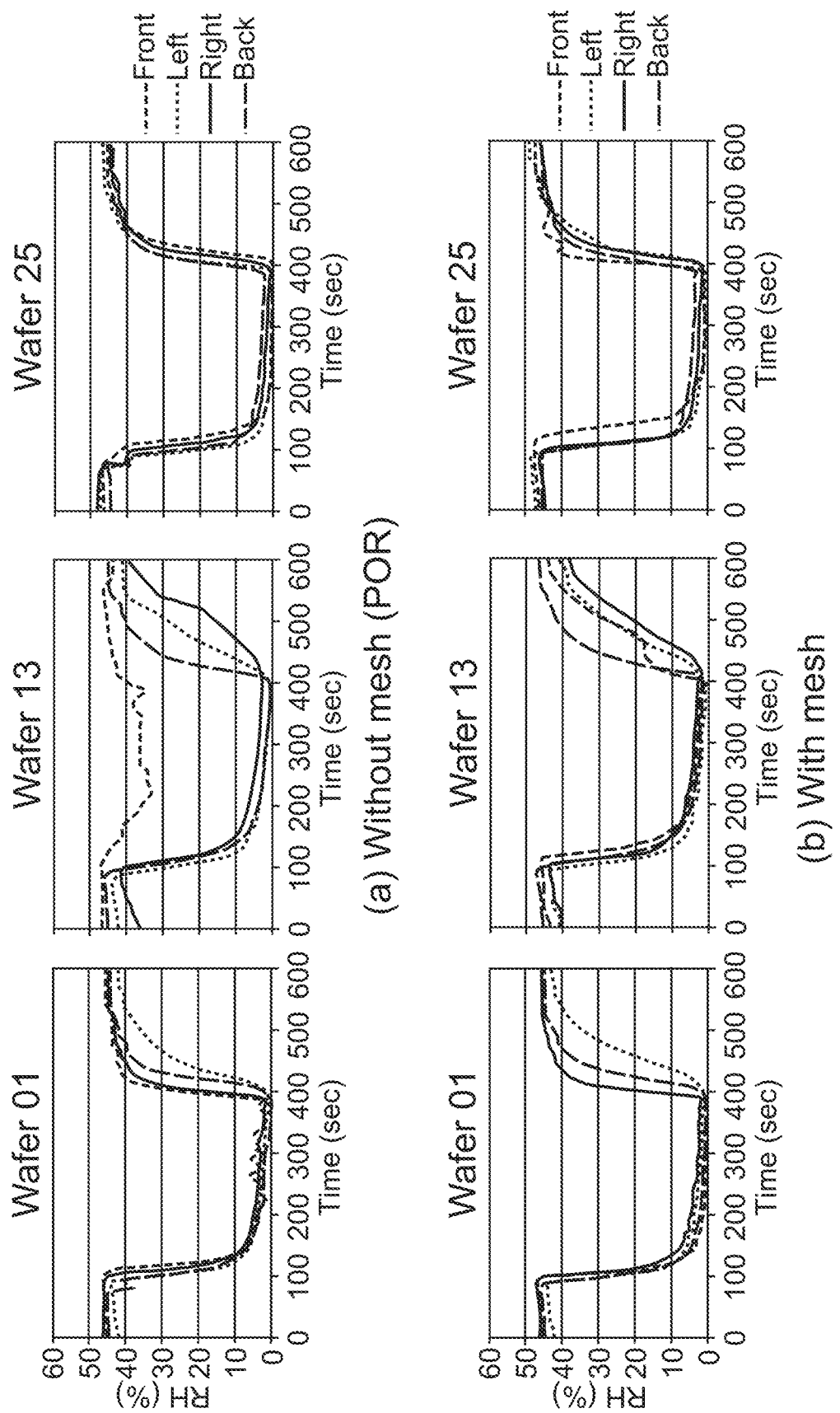

FIG. 13 shows the open door purge results recorded for a FOUP docked at an EFEM with extra clean dry air (XCDA) flowing within the EFEM at a flow rate of 20 lpm/port. The percent relative humidity (% RH) inside the FOUP was recorded at the front, left side, right side, and back of Wafer 1, Wafer 13 and Wafer 25 located inside the FOUP. FIG. 13 shows that the percent relative humidity (% RH) measured at the front of Wafer 13 located inside the FOUP is decreased when a mesh laminar flow element is present within the Sinfonia LP EFEM. No significant change in percent relative humidity (% RH) is observed at Wafers 1 and 25.

Figure 14:
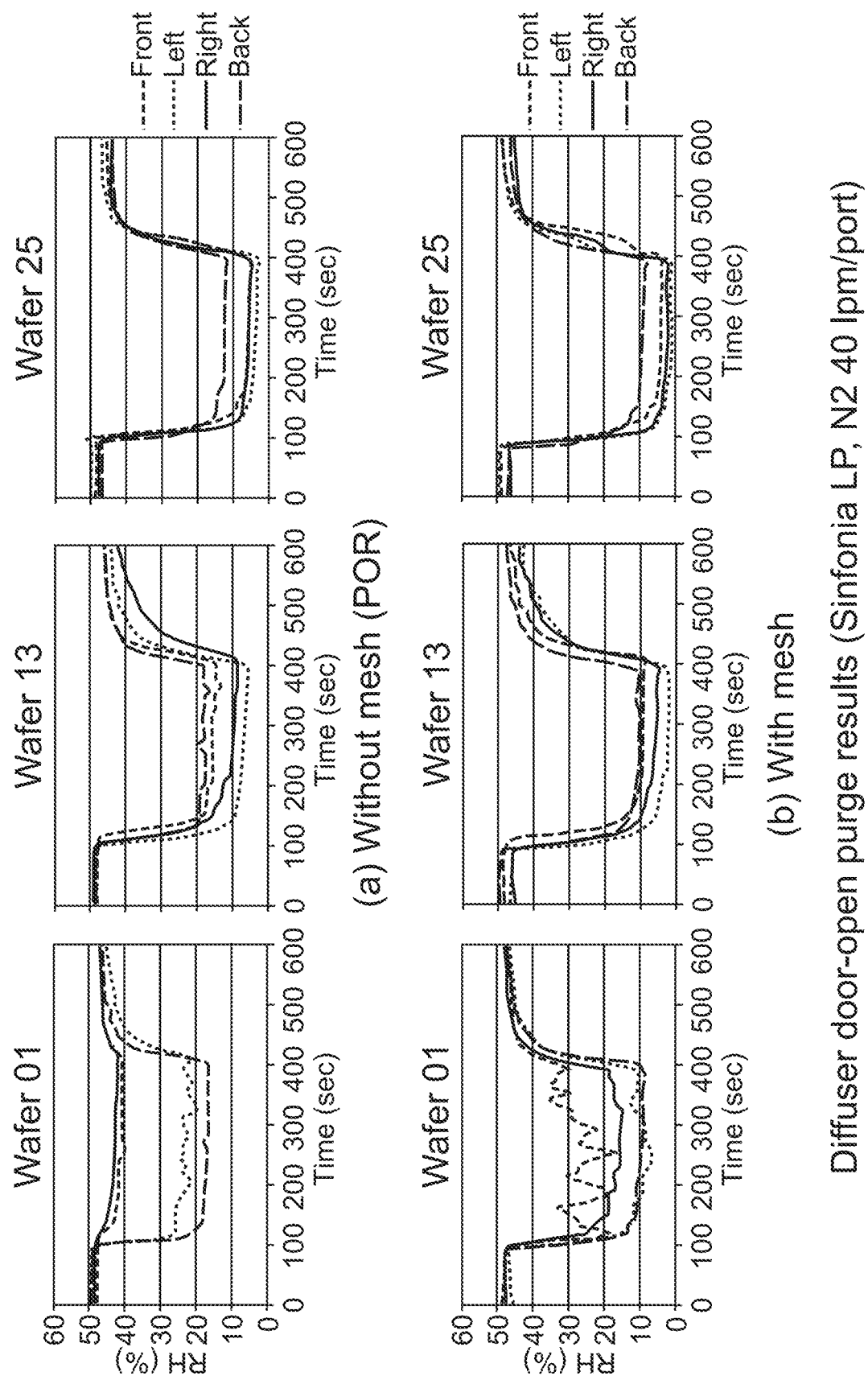

FIG. 14 shows the open door purge results recorded for a FOUP docked at an EFEM with nitrogen gas (N2) flowing within the EFEM at a flow rate of 40 lpm/port. The percent relative humidity (% RH) inside the FOUP was recorded at the front, left side, right side, and back of wafer numbers Wafer 1, Wafer 13 and Wafer 25 located inside the FOUP. FIG. 14 shows that the percent relative humidity (% RH) measured at all four locations on Wafer 1 located inside the FOUP is decreased when a mesh laminar flow element is present within the Sinfonia LP EFEM. A moderate decrease in percent relative humidity is observed at Wafer 13 when a mesh laminar flow element in included within the EFEM. No significant change in the percent relative humidity is observed at Wafer 25.

Figure 15:
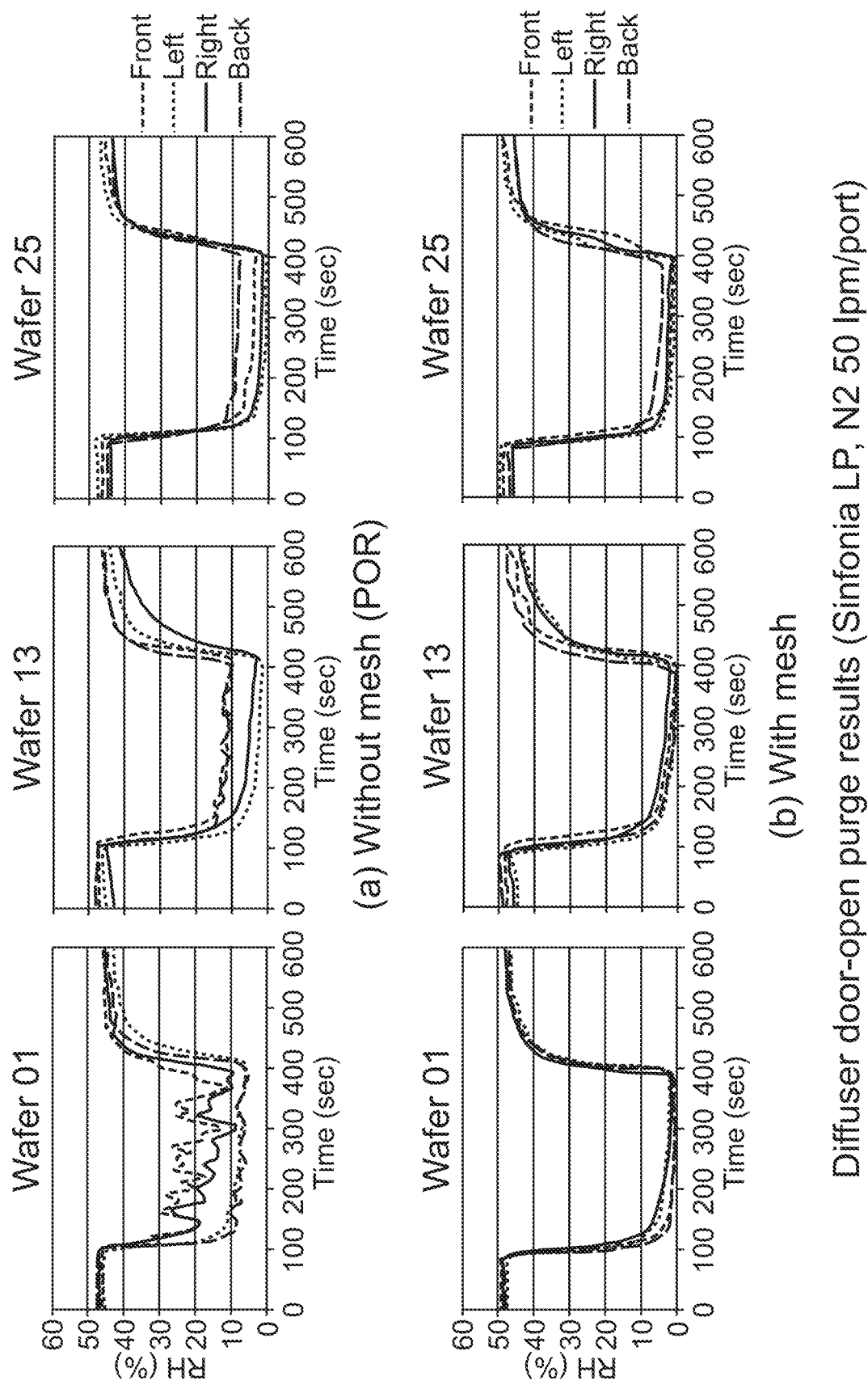

FIG. 15 shows the open door purge results recorded for a FOUP docked at an EFEM with nitrogen gas (N2) flowing within the EFEM at a flow rate of 50 lpm/port. The percent relative humidity (% RH) inside the FOUP was recorded at the front, left side, right side, and back of Wafer 1, Wafer 13 and Wafer 25 located inside the FOUP. FIG. 15 shows that the percent relative humidity (% RH) measured at all four locations on Wafer 1 located inside the FOUP is decreased when a mesh laminar flow element is present within the Sinfonia LP EFEM. A similar decrease in percent relative humidity (% RH) is observed for all four locations of Wafer 13 located in the approximate middle of the FOUP. No significant change in the percent relative humidity is observed at Wafer 25.

From the results shown in FIGS. 12-15, one can begin to conclude that the incorporation of a mesh laminar flow element into the EFEM has a greater impact on the percent relative humidity at higher flow rates.

FIGS. 16-19 show the percent relative humidity (% RH) recorded at the front, left side, right side, and back of Wafers 1, 13, and 25 contained within a FOUP docked at a Brooks Automation, Inc. load port (Brooks LP). The relative humidity levels at the different locations were recorded under different purging conditions (e.g. gas flow rate and gas) with and without a mesh flow modification element present within the EFEM interior.

Figure 16:
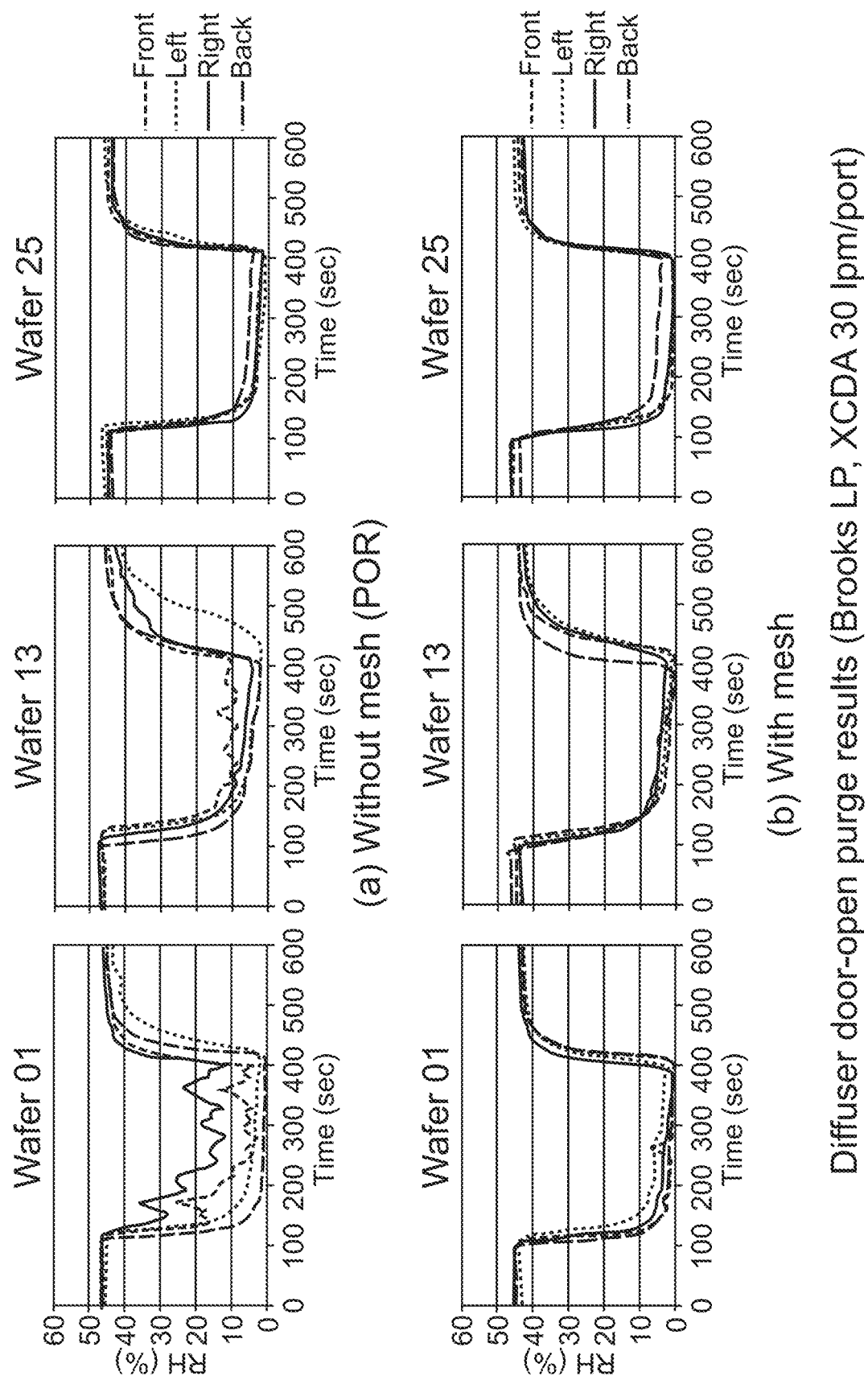

FIG. 16 shows the open door purge results recorded for a FOUP docked at a Brooks EFEM with extra clean dry air (XCDA) flowing within the EFEM at a flow rate of 30 lpm/port. The percent relative humidity (% RH) inside the FOUP was recorded at the front, left side, right side, and back of Wafer 1, Wafer 13 and Wafer 25 located inside the FOUP. FIG. 16 shows that the percent relative humidity (% RH) measured at the front and right side of Wafer 1 located inside the FOUP is decreased when a mesh laminar flow element is present within the Brooks EFEM. A decrease in percent relative humidity (% RH) is also observed at the front of Wafer 13. Wafer 13 is located in the approximate middle of the FOUP. No significant change in the percent relative humidity is observed at Wafer 25.

Because of its location at the top of the FOUP, Wafer 1 is the most likely wafer to be affected by the deflection of gas into the FOUP and also the turbulent flow of gas flowing past the FOUP opening. As such, the most significant reduction in the percent relative humidity is observed at Wafer 1. Wafer 25, located at the bottom of the FOUP, is least likely to be affected by the deflection of gas into the FOUP and also the turbulent flow of gas flowing past the FOUP opening. As such, it is not surprising that no significant change in the present relative humidity was observed at the various locations (e.g. front, left, right and back) of Wafer 25.

Figure 17:
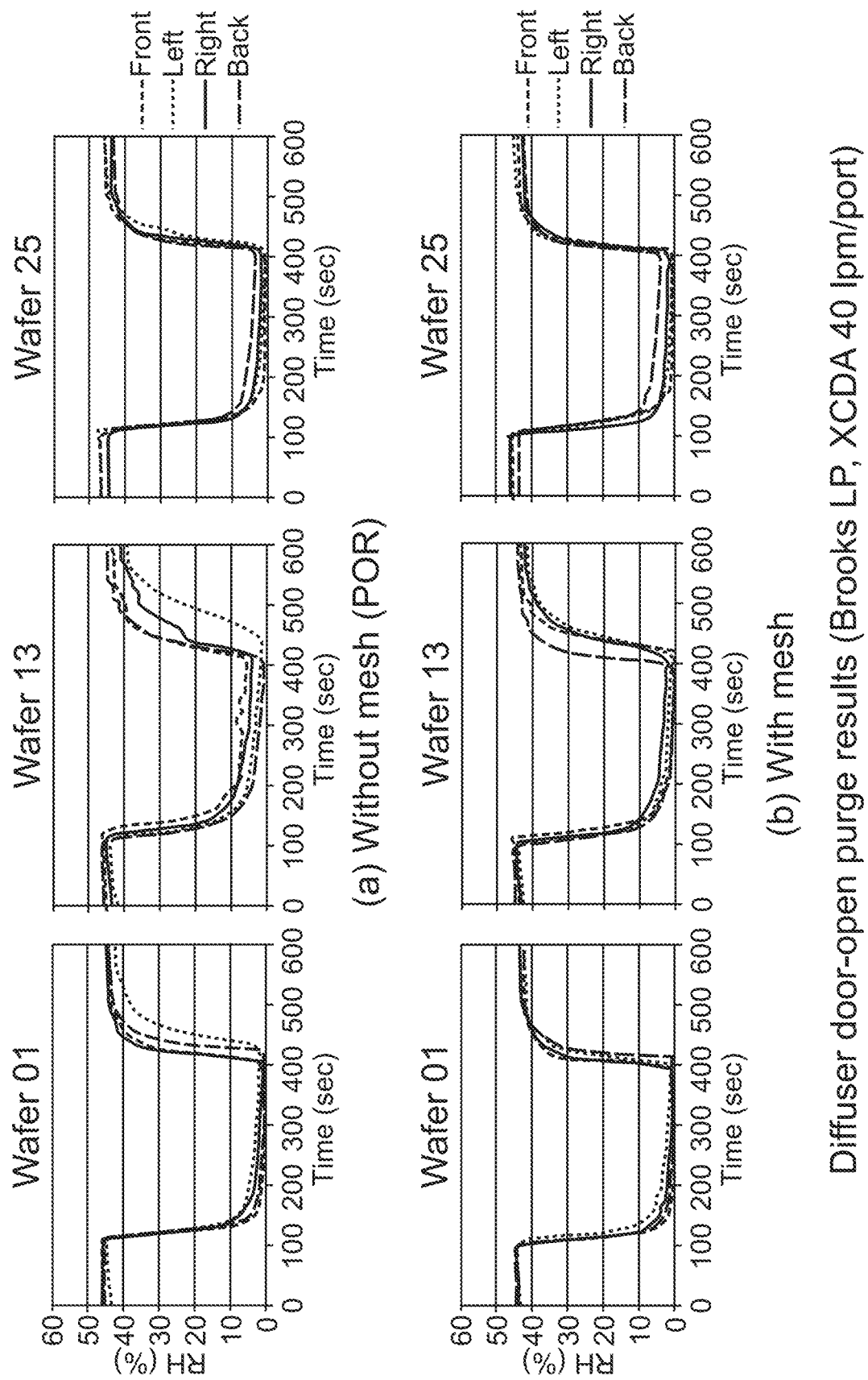

FIG. 17 shows the open door purge results recorded for a FOUP docked at a Brooks EFEM with extra clean dry air (XCDA) flowing within the EFEM at a flow rate of 40 1lpm/port. The percent relative humidity (% RH) inside the FOUP was recorded at the front, left side, right side, and back of Wafer 1, Wafer 13 and Wafer 25 located inside the FOUP. No significant change in percent relative humidity (% RH) is observed at any of the locations on Wafers 1, 13, and 25.

Figure 18:
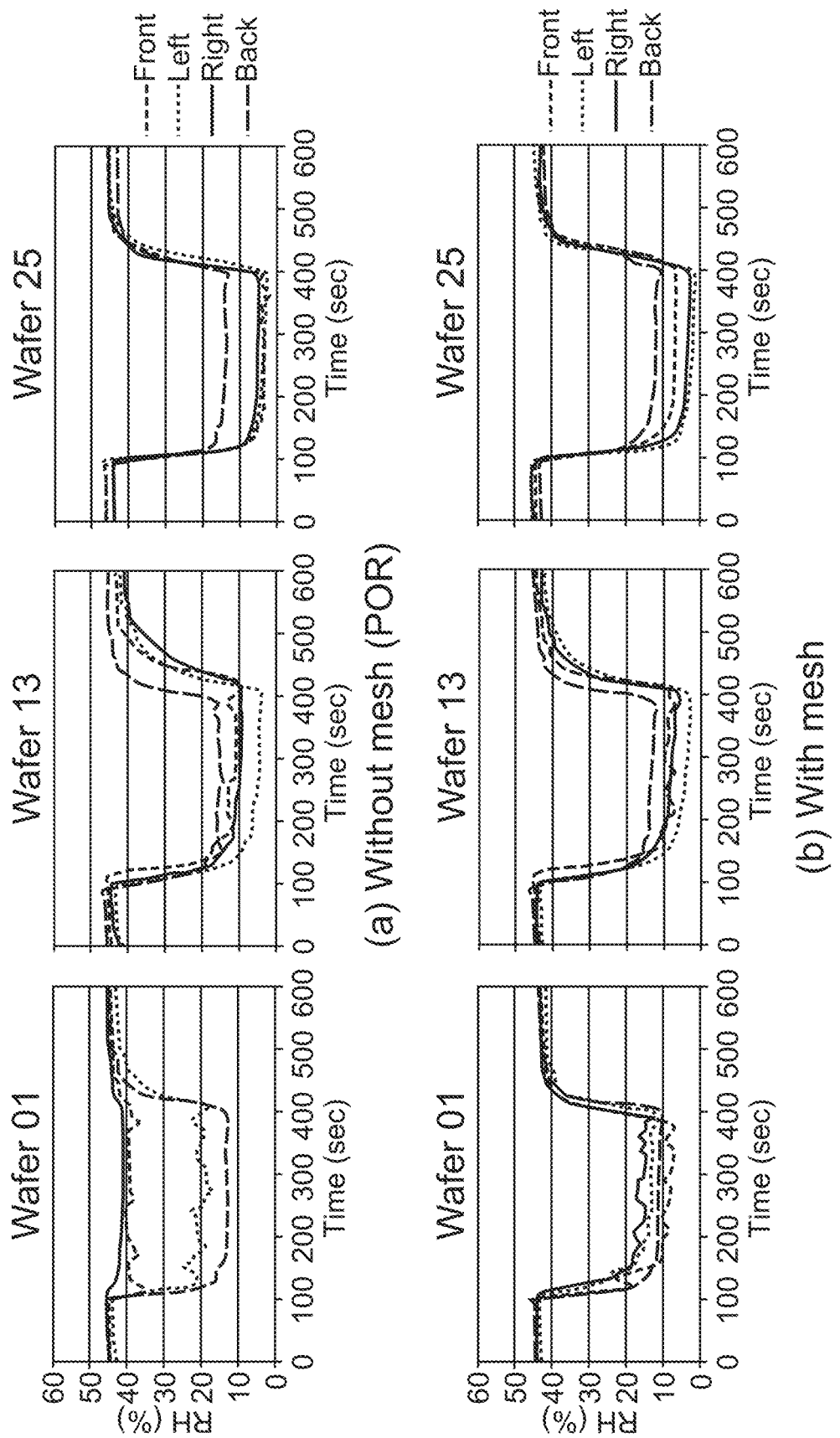

FIG. 18 shows the open door purge results recorded for a FOUP docked at a Brooks EFEM with nitrogen gas (N2) flowing within the EFEM at a flow rate of 40 lpm/port. The percent relative humidity (% RH) inside the FOUP was recorded at the front, left side, right side, and back of wafer numbers Wafer 1, Wafer 13 and Wafer 25 located inside the FOUP. FIG. 18 shows that the percent relative humidity (% RH) measured at all four locations on Wafer 1 located inside the FOUP is decreased when a mesh laminar flow element is present within the Brooks EFEM. A moderate decrease in percent relative humidity is observed at the front and right side of Wafer 13 when a mesh laminar flow element in included within the EFEM. No significant change in the percent relative humidity is observed at Wafer 25.

Figure 19:
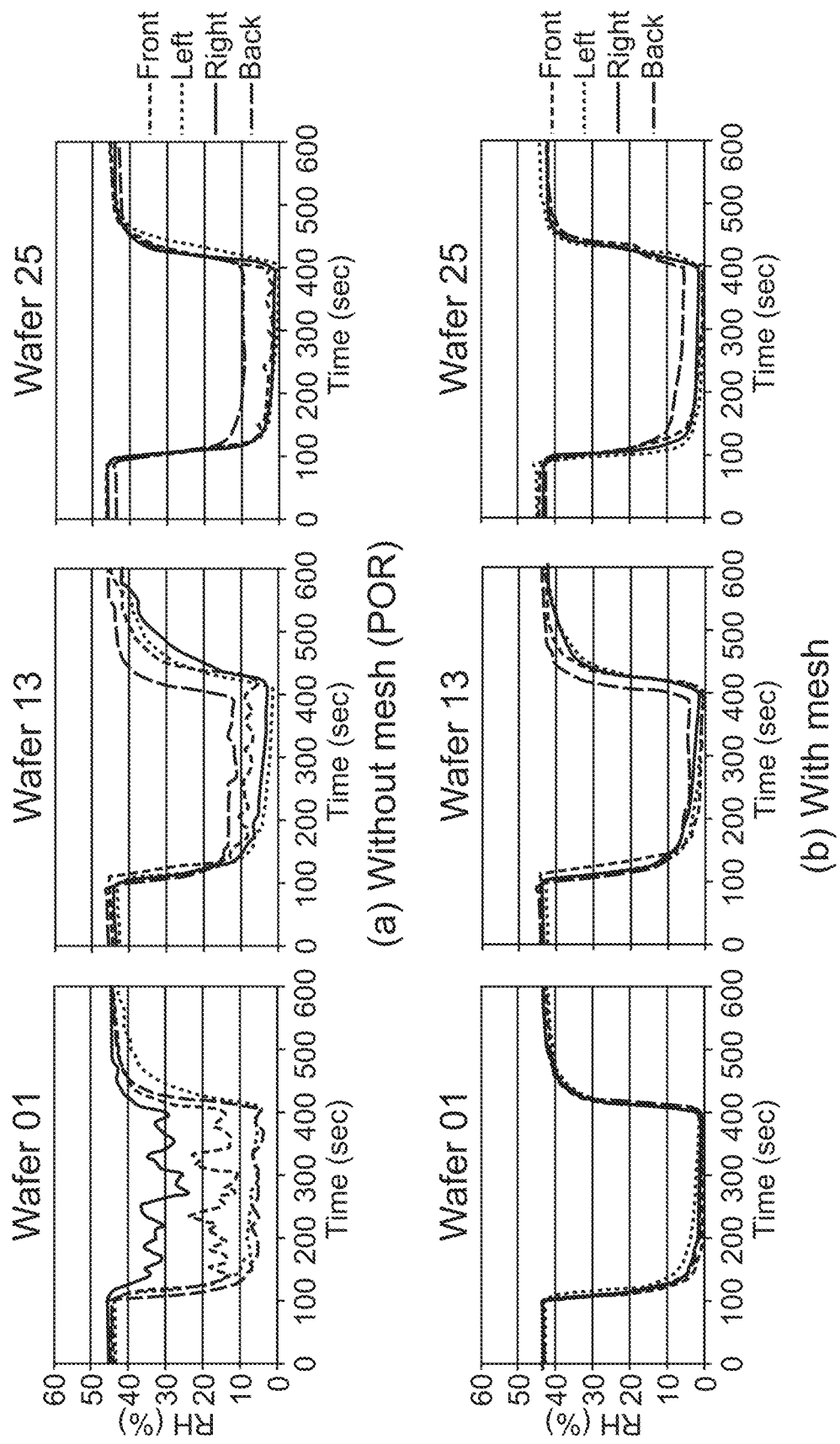

FIG. 19 shows the open door purge results recorded for a FOUP docked at a Brooks EFEM with nitrogen gas (N2) flowing within the EFEM at a flow rate of 50 lpm/port. The percent relative humidity (% RH) inside the FOUP was recorded at the front, left side, right side, and back of Wafer 1, Wafer 13 and Wafer 25 located inside the FOUP. FIG. 9 shows that the percent relative humidity (% RH) measured at all four locations on Wafer 1 located inside the FOUP is decreased when a mesh laminar flow element is present within the Brooks EFEM. A moderate decrease in percent relative humidity (% RH) is observed at the front and back of Wafer 13 located in the approximate middle of the FOUP. No significant change in the percent relative humidity is observed at Wafer 25.

As evidenced by the test results shown in FIGS. 12-19, the overall purge performance FOUP is improved at both EFEMs for either gas and at different flow rates when a mesh laminar flow element is present within the EFEM.

Particle Test

Figure 20:
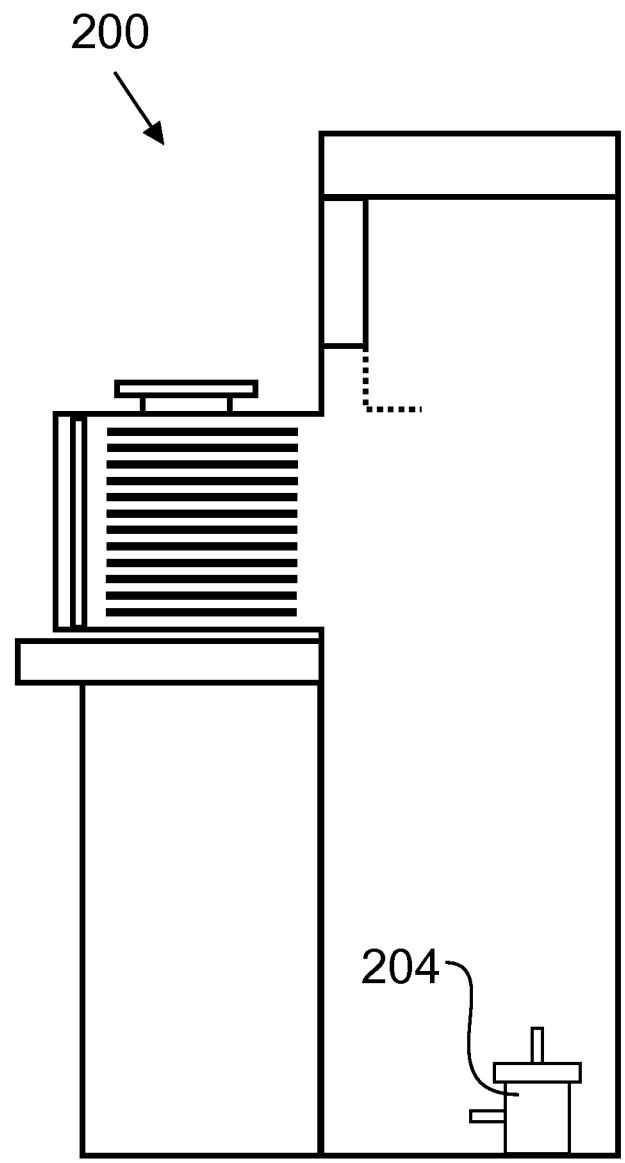
FIG. 20 is a schematic showing a particle test setup.

FOUP purging is also known to prevent particles or AMCs from infiltrating into the FOUP which can be generated from a damaged FFU or any moving parts within the EFEM. FIG. 20 shows the test setup 200 to evaluate the EFC effect on the wafer protection from particle contamination. This test is to evaluate EFC particle prevention efficiency by measuring particle adders on wafers with/without EFC/ diffuser purging. 100 nm PSL particles were generated by an atomizer 204 for 30 seconds during the CDA purging (40 slpm/port). Particle adders on wafer 1 and 25 were measured by comparing particle counts in 90-120 nm size bin between pre and post scans (KLA Tencor, SP1-TBI). Three test conditions were evaluated: (1) diffuser purging with EFC, (2) diffuser purging only, and (3) no purging and no EFC.

Table 2, below, shows the EFC particle test results showing particle adders and particle prevention efficiency for the three different test conditions. As shown in the results, the EFC can improve the particle prevention efficiency from 67% (diffuser-only) to 99% (diffuser+EFC) for wafer 1 and 89% to 97% for wafer 25.

TABLE 2

| | Particle adders (Prevention efficiency) | | |
|---|---|---|---|
| | Diffuser + EFC | Diffuser only | No purging/No EFC |
| Wafer 1 | 7 (99%) | 234 (67%) | 705 |
| Wafer 2 | 80 (97%) | 335 (89%) | 3120 |

Figure 21B:
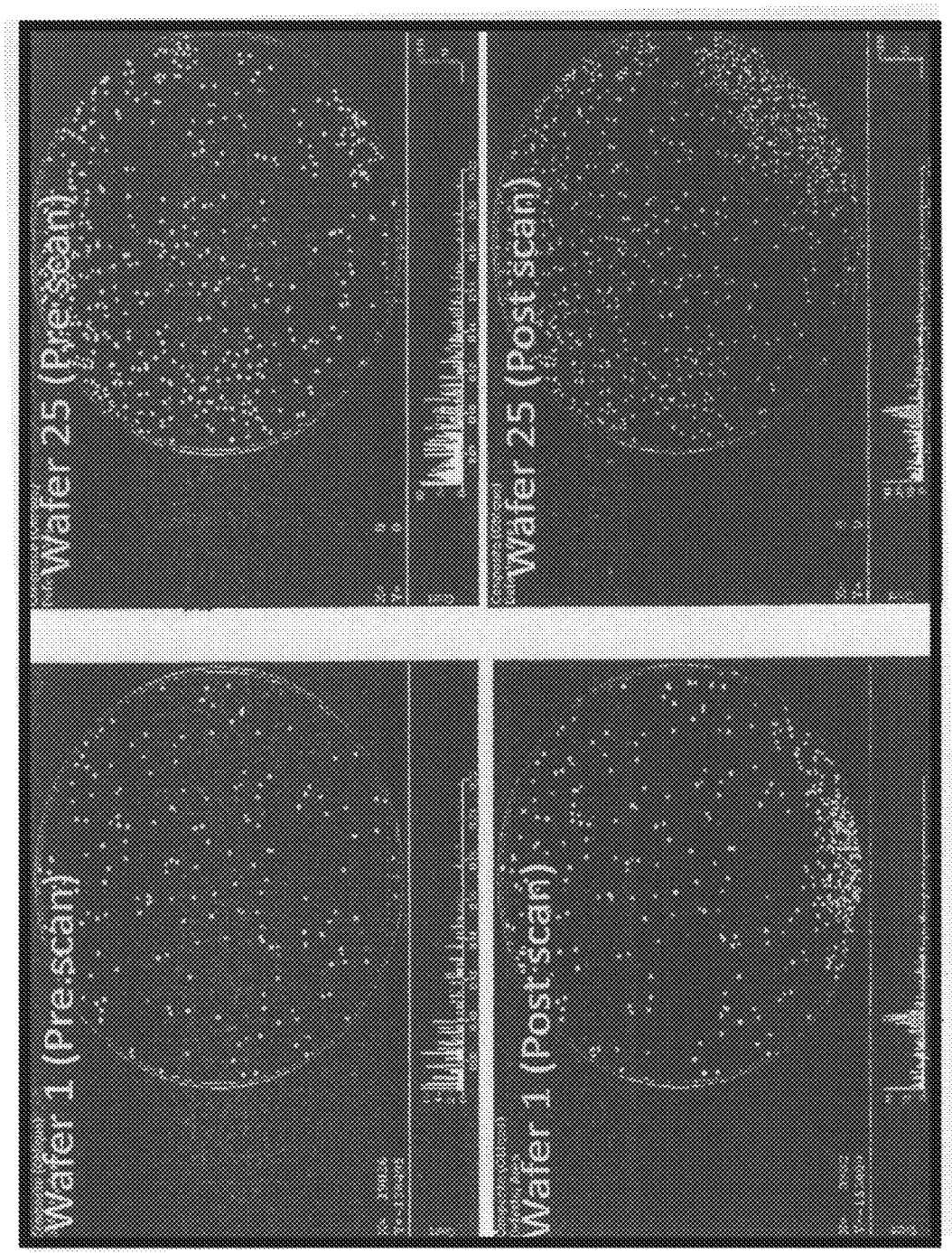

FIGS. 21A-21C show the pre/post scan maps for each test configuration and 100 nm PSL particle deposition is clearly observed in the maps (orange color in the maps, 90-120 nm size bin). Particle deposition for the diffuser-only configuration is mostly concentrated at the wafer front location, while no purging/no EFC configuration shows wafer front deposition on wafer 1 and wafer back deposition on wafer 25. This is because without purging, the EFEM air penetrates into lower slots of the FOUP and exits from back side of higher slots.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A flow modification fixture comprising:
a sheet of material connected to an interior wall above an opening of an equipment front end module such that the sheet of material extends away from the interior wall into an interior of the equipment front end module at an angle and wherein the sheet has a first side that is sized to extend along the opening of the opening of the equipment front end module, the first side having a first dimension that is at least equal to a width of a load port opening of the equipment front end module and a second side that extends into the interior of the equipment front end module, the second side having a second dimension that is that is sufficient to deflect gas flow away from the opening of the equipment front end module inside the equipment front end module when the sheet of material extends into the equipment front end module interior wherein the sheet of material induces laminar flow across the opening of the equipment front end module and the sheet of material comprises a plurality of apertures which produce the laminar flow across the opening of the equipment front end module, wherein the fixture extends into the interior of the equipment front end module at an angle greater than ninety degrees measured relative to the interior wall.

2. The flow modification fixture according to claim 1, wherein the fixture is integrally formed with interior wall of the equipment front end module.

3. The flow modification fixture according to claim 1, wherein the fixture is physically connected to the interior wall of the equipment front end module.

4. The flow modification fixture according to claim 1, wherein the angle is a ninety degree angle measured relative to the interior wall.

5. The flow modification fixture according to claim 1, wherein the sheet of material comprises a metal mesh.

6. An equipment front end module comprising a flow modification feature projecting away from an interior wall of the equipment front end module and into an interior of the equipment front end module at an angle, the flow modification feature deflecting a flow of gas flowing from a top to a bottom of the equipment front end module from an opening of the equipment front end module, wherein the flow modification feature induces laminar flow across the opening of the equipment front end module using a sheet of material containing a plurality of openings spaced so as to induce laminar flow, wherein the fixture extends into the interior of the equipment front end module at an angle greater than ninety degrees measured relative to the interior wall.

7. The equipment front end module according to claim 6, wherein the angle is a ninety degree angle measured relative to the interior wall of the equipment front end module.

8. The equipment front end module according to claim 6, wherein the flow modification feature is connected to the interior wall.

9. The equipment front end module according to claim 6, wherein the flow modification feature is integrally formed with the interior wall.

10. The equipment front end module according to claim 6, wherein the flow modification feature comprises a plurality of openings.

* * * * *